US010991765B2

(12) United States Patent
Freier et al.

(10) Patent No.: US 10,991,765 B2
(45) Date of Patent: *Apr. 27, 2021

(54) OPTICAL STACK FOR IMPROVED COLOR UNIFORMITY IN OLED DISPLAY

(71) Applicant: 3M INNOVATIVE PROPERTIES COMPANY, St. Paul, MN (US)

(72) Inventors: David G. Freier, St. Paul, MN (US); Robert L. Brott, Woodbury, MN (US); Justin P. Meyer, Oakdale, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/716,922

(22) Filed: Dec. 17, 2019

(65) Prior Publication Data

US 2020/0127058 A1   Apr. 23, 2020

Related U.S. Application Data

(63) Continuation of application No. 16/301,142, filed as application No. PCT/US2017/033291 on May 18, 2017, now Pat. No. 10,566,391.

(Continued)

(51) Int. Cl.
*H01L 27/32* (2006.01)
*H01L 51/52* (2006.01)
*B82Y 20/00* (2011.01)

(52) U.S. Cl.
CPC .......... *H01L 27/3209* (2013.01); *H01L 27/32* (2013.01); *H01L 27/3211* (2013.01); *H01L 51/5275* (2013.01); *B82Y 20/00* (2013.01)

(58) Field of Classification Search
CPC . H01L 27/3209; H01L 27/3211; H01L 27/32; H01L 51/5275; H01L 51/5237
See application file for complete search history.

(56) References Cited

U.S. PATENT DOCUMENTS 4,374,077 A   2/1983   Kerfeld
4,576,850 A   3/1986   Martens
(Continued)

FOREIGN PATENT DOCUMENTS

CN   204029875   12/2014
EP   2 623 285   8/2013
(Continued)

OTHER PUBLICATIONS

Burzynski, "Large optical birefringence in poly(p-phenylene vinylene) films measured by optical waveguide techniques", Polymer, Apr. 1990, vol. 31, No. 4, pp. 627-630.

(Continued)

*Primary Examiner* — Herve-Louis Y Assouman
(74) *Attorney, Agent, or Firm* — Clifton F. Richardson

(57) ABSTRACT

Optical stacks configured to reduce variation of color with view angle in organic light emitting diode (OLED) displays having an emissive OLED layer are described. An optical stack having first and second layers with differing refractive indices includes a nanostructured interface between the first and second layers. The second layer can be disposed between the first layer and the emissive layer with the nanostructured interface proximate to, and outside of, an evanescent zone of the emissive layer. The nanostructured interface has a substantially azimuthally symmetric power spectral density (PSD) and a wavenumber-PSD product has a maximum for a wavenumber larger than 6 radians/micrometer times the refractive index of the second layer. For all wavenumbers lower than 6 radians/micrometer times the second refractive index, the wavenumber-PSD product is no more than 0.3 times the maximum.

15 Claims, 16 Drawing Sheets

Related U.S. Application Data

(60) Provisional application No. 62/342,620, filed on May 27, 2016.

(56) References Cited

U.S. PATENT DOCUMENTS

| | | | |
|---|---|---|---|
| 5,175,030 | A | 12/1992 | Lu |
| 5,271,968 | A | 12/1993 | Coyle |
| 5,558,740 | A | 9/1996 | Bernard |
| 5,995,690 | A | 11/1999 | Kotz |
| 6,005,137 | A | 12/1999 | Moore |
| 6,181,396 | B1 | 1/2001 | Kanoh |
| 6,329,058 | B1 | 12/2001 | Arney |
| 7,801,716 | B2 | 9/2010 | Freier |
| 8,460,568 | B2 | 6/2013 | David |
| 8,538,224 | B2 | 9/2013 | Lamansky |
| 8,541,778 | B2 | 9/2013 | Seki |
| 10,566,391 | B2 * | 2/2020 | Freier .................. H01L 27/32 |
| 2004/0109664 | A1 | 6/2004 | Ohtsuki |
| 2010/0110551 | A1 | 5/2010 | Lamansky |
| 2010/0150513 | A1 | 6/2010 | Zhang |
| 2010/0164364 | A1 | 7/2010 | Eida |
| 2010/0219427 | A1 | 9/2010 | Fukuda |
| 2010/0244062 | A1 | 9/2010 | Ueno |
| 2012/0038990 | A1 | 2/2012 | Hao |
| 2012/0098421 | A1 | 4/2012 | Thompson |
| 2013/0051032 | A1 | 2/2013 | Jones |
| 2014/0049822 | A1 | 2/2014 | Gollier |
| 2014/0193612 | A1 | 7/2014 | Yu |
| 2014/0326988 | A1 | 11/2014 | Yamaguchi |
| 2015/0034925 | A1 | 2/2015 | Shinotsuka |
| 2015/0060840 | A1 | 3/2015 | Nishimura |
| 2015/0076468 | A1 | 3/2015 | Yamaguchi |
| 2015/0084017 | A1 | 3/2015 | Dai |
| 2015/0331315 | A1 | 11/2015 | Yang |
| 2015/0337494 | A1 | 11/2015 | Takahashi |
| 2016/0146982 | A1 | 5/2016 | Boyd |

FOREIGN PATENT DOCUMENTS

| | | |
|---|---|---|
| JP | 8-184846 | 7/1996 |
| JP | 2015-530284 | 10/2015 |
| JP | 2016-035932 | 3/2016 |
| WO | WO 2013/187149 | 12/2013 |
| WO | WO 2014/014595 | 1/2014 |
| WO | WO 2014-031421 | 2/2014 |
| WO | WO 2014/123093 | 8/2014 |
| WO | WO 2015-115046 | 8/2015 |
| WO | WO 2015-196573 | 12/2015 |

OTHER PUBLICATIONS

Cho, "Light diffusing effects of nano and microstructures on OLED with microcavity", Optics Express, Oct. 20, 2014, vol. 22, No. S6, pp. A1507-A1518.

Choy, "Improving the viewing angle properties of microcavity OLEDs by using dispersive gratings", Optics Express, Oct. 1, 2007, vol. 15, No. 20, pp. 13288-13294.

Nakanishi, "Improvement of the light extraction efficiency of top-emitting organic light-emitting diodes by a two-dimensional diffraction layer fabricated using self-assembled nanoparticles", Applied Optics, vol. 48, No. 31, Nov. 1, 2009, pp. 5889-5896, XP055055051.

Rice, "Reflection of electromagnetic waves from slightly rough surfaces", Communications on Pure and Applied Mathematics, Aug. 1951, vol. 4, No. 2-3, pp. 351-378.

Siqueira, "Numerical simulation of scatterer positions in a very dense medium with an application to the two-dimensional Born approximation", Radio Science, Sep.-Oct. 1995, vol. 30, No. 5, pp. 1325-1339.

Yang, "Group Contribution to Molar Refraction and Refractive Index of Conjugated Polymers", Chemistry of Materials, Jul. 1995, vol. 7, No. 7, pp. 1276-1285.

International Search Report for PCT International Application No. PCT/US2017/033291, dated Sep. 12, 2017, 4 pages.

Yue, Dissertation for Doctoral Degree, "Investigation on Increasing Light-emitting Efficiency of Light-emitting Diodes by Using Nano Dielectric Structures", Shandong University, Dec. 31, 2014, 162 pp.

* cited by examiner

… (1)

OPTICAL STACK FOR IMPROVED COLOR UNIFORMITY IN OLED DISPLAY

BACKGROUND

Organic light emitting diode (OLED) displays often produce a light output having a color that varies with view direction.

U.S. Pat. Appl. Pub. No. 2010/0110551 (Lamansky et al.) describes a multifunctional optical film for enhancing light extraction that includes a flexible substrate, a structured layer, a high index backfill layer, and an optional passivation layer. The structured layer effective uses microreplicated diffractive or scattering nanostructures located near enough to the light generation region to enable extraction of an evanescent wave from an OLED device.

U.S. Pat. No. 8,538,224 (Lamansky et al.) describes a light extraction film having internal nanostructures and external microstructures for OLED devices. The light extraction film includes a flexible substantially transparent film, a low index nanostructured layer applied to the film, and a high index planarizing backfill layer applied over the nanostructured layer. External optical microstructures are applied to the flexible substantially transparent film on a side opposite the nanostructured layer to enhance light extraction from the OLED devices while providing for a more uniform luminance distribution.

U.S. Pat. No. 8,541,778 (Seki et al.) describes a diffraction grating having a transparent supporting substrate; and a cured resin layer which is stacked on the transparent supporting substrate and which has concavities and convexities formed on a surface thereof, wherein when a Fourier-transformed image is obtained by performing two-dimensional fast Fourier transform processing on a concavity and convexity analysis image obtained by analyzing a shape of the concavities and convexities formed on the surface of the cured resin layer by use of an atomic force microscope, the Fourier-transformed image shows a circular or annular pattern.

SUMMARY

In some aspects of the present description, an organic light emitting diode (OLED) display including an emissive OLED layer and a nanostructured interface between first and second layers is provided. The second layer disposed between the first layer and the emissive OLED layer, the first layer has a first refractive index, the second layer has a different second refractive index being at least 1.4, and the nanostructured interface is disposed proximate to an outside an evanescent zone of the emissive OLED layer. The nanostructured interface has a substantially azimuthally symmetric power spectral density, PSD, and a wavenumber-PSD product having a maximum for a wavenumber larger than 6 radians/micrometer times the second refractive index. For all wavenumbers less than 6 radians/micrometer times the second refractive index, the wavenumber-PSD product is no more than 0.3 times the maximum.

In some aspects of the present description, an organic light emitting diode (OLED) display including an emissive OLED layer, a nanostructured interface disposed proximate to the emissive OLED layer, and an interior layer disposed between the emissive OLED layer and the nanostructured interface is provided. When the display is fully on, a first light output from the emissive OLED layer at a view angle of zero degrees relative to a normal to the display has a first color in the interior layer and a second color exterior to the display, and a second light output from the emissive OLED layer at a view angle of 45 degrees relative to the normal to the display has a third color in the interior layer and a fourth color exterior to the display. The first and third colors having a first chromaticity distance therebetween, and the second and fourth colors having a second chromaticity distance therebetween. The nanostructured interface is configured such that the second chromaticity distance is less than 0.75 times the first chromaticity distance.

An organic light emitting diode (OLED) display including an emissive OLED layer and a nanostructured interface between two adjacent layers is provided. The nanostructured interface has a substantially azimuthally symmetric power spectral density and is disposed proximate to and outside an evanescent zone of the emissive OLED layer. The nanostructured interface is configured to provide substantially no diffractive transmission for light from the emissive OLED layer at a view direction normal to the emissive OLED layer and is configured to provide diffractive transmission for light from the emissive OLED layer in at least some view directions at an angle greater than 10 degrees to normal.

In some aspects of the present description, an organic light emitting diode (OLED) display an emissive OLED layer, and a nanostructured interface between first and second layers is provided. The second layer disposed between the first layer and the emissive OLED layer, the first layer has a first refractive index, and the second layer has a different second refractive index, the second refractive index being at least 1.6. The nanostructured interface is disposed proximate to and outside an evanescent zone of the emissive OLED layer. The nanostructured interface has a variance in displacement from a mean displacement of the interface, Var, and a substantially azimuthally symmetric power spectral density, PSD. A first integral of the PSD over an area bound by a circle in Fourier space centered at zero wavenumber and having a radius of 9 radians/micrometer times the second refractive index is no more than 4 times Var.

In some aspects of the present description, a method of reducing variation of color with view angle in an organic light emitting diode (OLED) display is provided. The method includes providing an encapsulated emissive OLED layer and disposing an optical stack onto the encapsulated emissive OLED layer. The optical stack includes a nanostructured interface between continuous first and second layers, the second layer disposed between the first layer and the encapsulated emissive OLED layer, the first layer having a first refractive index, the second layer having a different second refractive index, the optical stack configured to reduce color variation with view angle of light output from the OLED display. The nanostructured interface has a substantially azimuthally symmetric power spectral density.

In some aspects of the present description, the use of an optical stack for reducing variation of color with view angle in an organic light emitting diode (OLED) display is provided. The optical stack includes a nanostructured interface between first and second layers, where the first layer has a first refractive index and the second layer has a different second refractive index. The optical stack is disposed on an encapsulated emissive OLED layer with the second layer between the first layer and the encapsulated emissive OLED layer. The nanostructured interface has a power spectral density such that for any first wavevector having a first magnitude between 10 radians/micrometer times the second refractive index and 13 radians/micrometer times a sum of the second refractive index and 0.8, a maximum difference between a local average of the power spectral density at the first wavevector is between 0.7 and 1.3 times an annular average of the power spectral density at the first wavevector. The local average is an average of the power spectral density over an annular sector in Fourier space centered on the first wavevector and having an inner radius of 0.9 times the first magnitude, an outer radius of 1.1 times the first magnitude, and a subtended angle of 60 degrees. The annular average is an average of the power spectral density over an annulus in Fourier space having an inner radius of 0.9 times the first magnitude and an outer radius of 1.1 times the first magnitude.

DETAILED DESCRIPTION

In the following description, reference is made to the accompanying drawings that forms a part hereof and in which various embodiments are shown by way of illustration. The drawings are not necessarily to scale. It is to be understood that other embodiments are contemplated and may be made without departing from the scope or spirit of the present disclosure. The following detailed description, therefore, is not to be taken in a limiting sense.

Organic light emitting diode (OLED) displays often produce a light output having a color that varies with view direction. This effect is particularly objectionable in strong cavity OLEDs where a cavity between the cathode and anode of the emissive stack of the OLED has an output that depends on wavelength and view angle approximately as the cosine of the view angle divided by the wavelength of the light in the cavity. According to the present description, optical stacks including a nanostructured interface have been found that when placed proximate an emissive layer of an OLED display reduces the variation in color with view direction without significantly changing the on-axis light output of the display. A nanostructured interface is an interface between two materials that includes nanostructures where nanostructures are structures having a least one length scale in a range of 1 nm to 1000 nm. In some embodiments, the nanostructures have a least one length scale in a range of 10 nm to 500 nm, or in a range of 100 nm to 350 nm.

Figure 1:
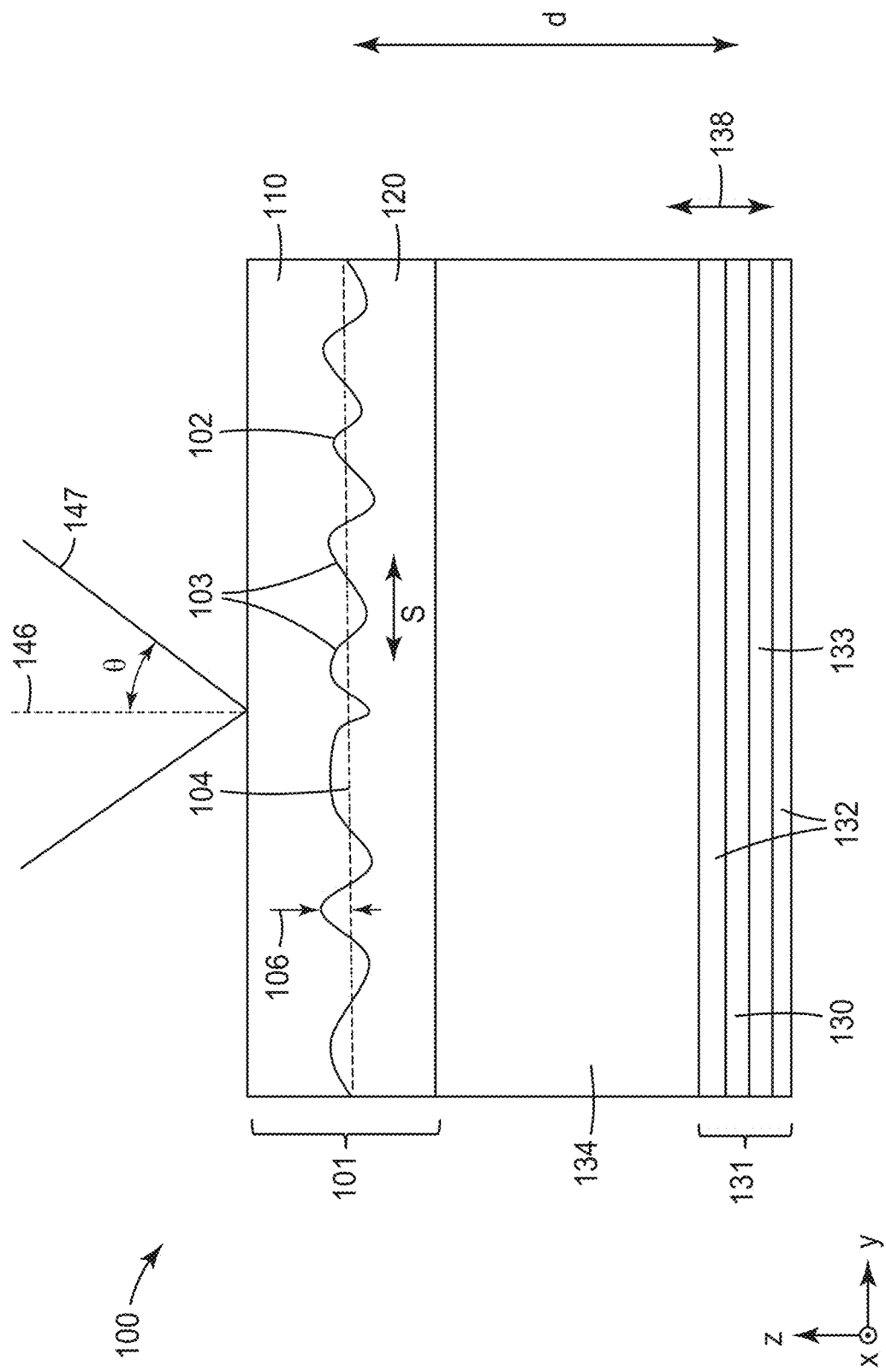
FIG. 1 is a cross-sectional view of an organic light emitting diode (OLED) display.

FIG. 1 is a cross-sectional view of an organic light emitting diode (OLED) display 100 including an optical stack 101 disposed proximate to and outside of an evanescent zone 138 of an emissive OLED layer 130. The evanescent zone 138 typically extends only a few wavelengths of visible light from the emissive OLED layer 130 in the z-direction. OLED stack 131 contains emissive layer 130, electrodes 132, and hole transport layer 133. An inner layer 134 separates the optical stack 101 from the emissive OLED layer 130. Inner layer 134 may be an encapsulant for the emissive OLED layer 130. The optical stack 100 includes nanostructured interface 102 disposed between first and second layers 110 and 120, with the second layer 120 disposed between the first layer 110 and the emissive OLED layer 130. The nanostructured interface 102 has a displacement 106, which will be denoted h(x,y), from a mean plane 104. The nanostructured interface 102 is disposed at a distance d from the emissive OLED layer 130. The distance d is the distance from the mean plane 104 to the top of the emissive OLED layer 130. In some embodiments, d is at least 5 micrometers, or at least 10 micrometers and in some embodiments, d is no more than 100 micrometers, or no more than 50 micrometers. The nanostructured interface 102 has a plurality of peaks 103 and an average spacing S between nearest neighbor peaks. As used herein, averages refer to unweighted arithmetic averages unless specified differently. The variance of the displacement 106 from the mean plane 104 of the nanostructured interface 102 will be denoted Var. FIG. 1 also illustrates a cone of view 147 for a pixel in the display 100, the cone of view 147 has a half-angle θ relative to a normal 146 to the display 100. The half-angle θ may be 60 degrees, for example.

In some embodiments, the first and second layers 110 and 120 are polymeric layers having a continuous polymeric phase. Either of the first and second layers 110 and 120 may include inorganic nanoparticles in order to modify the refractive index. Such nanoparticles typically have an average size less than 100 nm (the average size can be determined from the average volume V of the nanoparticles (unweighted arithmetic average) as $(6 \text{ V}/\pi)^{1/3}$). In some embodiments, a tool having a desired nanostructured surface is used to form the first layer 110 in a continuous cast and cure process as described further elsewhere herein. The second layer 120 can be formed by backfilling a nanostructured surface of the first layer 110 with a crosslinkable composition, for example. The backfill material can be applied to form the second layer 120 using, for example, one of the following methods: liquid coating; vapor coating; powder coating; lamination; dip-coating; or roll-to-roll coating. In some embodiments, the backfill material forms a planar surface opposite the nanostructured interface. Each of the first and second layers 110 and 120 may be continuous layers (e.g., a layer with a continuous polymeric phase). Each of the first and second layers 110 and 120 may be solid layers (e.g., hard or soft polymeric layers).

The first layer 110 may be a crosslinked resin layer and may have a refractive index in the range of 1.2 to 1.6, or in the range of 1.4 to 1.55, for example. As used herein, refractive index refers to the refractive index measured at 532 nm, unless specified differently or unless the context clearly indicates differently. In some embodiments, the second layer 120 has a refractive index of at least 1.4, or at least 1.5, or at least 1.6, or at least 1.7, or at least 1.75. In some embodiments, the second layer 120 has a refractive index larger than that of the first layer 110. The first and second layers 110 and 120 provide a refractive index contrast (absolute value of the difference in the refractive index of the second layer 120 and the refractive index of the first layer 110) across the nanostructured interface 102. In some embodiments, the refractive index contrast is constant along the nanostructured interface 102. In some embodiments, the refractive index contrast is in a range of 0.1, or 0.2, or 0.3 to 1.0. In some embodiments, the first layer 110 is an ultralow refractive index material, such as those described in U.S. Pat. App. Pub. No. 2012/0038990 (Hao et al.) which is hereby incorporated herein by reference to the extent that it does not contradict the present description, and has a refractive index in a range of 1.2 to 1.35 and the second layer 120 is a high index layer having a refractive index greater than 1.7.

Typically, it is desired to have a large refractive index contrast, since diffracted power transmitted through the nanostructured interface is proportional to the square of the refractive index contrast, and this can be achieved by utilizing a high refractive index material for the second layer 120. Examples of suitable materials for the second layer 120 include the following: high index inorganic materials; high index organic materials; a nanoparticle filled polymer material; silicon nitride; polymers filled with high index inorganic materials; and high index conjugated polymers. Examples of high index polymers and monomers are described in C. Yang, et al., Chem. Mater. 7, 1276 (1995), and R. Burzynski, et al., Polymer 31, 627 (1990) and U.S. Pat. No. 6,005,137, all of which are incorporated herein by reference to the extent that they do not contradict the present description. Examples of polymers filled with high index inorganic materials are described in U.S. Pat. No. 6,329,058, which is incorporated herein by reference to the extent that it does not contradict the present description. Examples of nanoparticles for the nanoparticle filled polymer material include the following high index materials: $TiO_2$, $ZrO_2$, $H_fO_2$, or other inorganic materials.

In some embodiments, the nanostructured interface 102 has a substantially azimuthally symmetric power spectral density (PSD). The PSD is given by taking the magnitude squared of the two-dimensional Fourier transform of the displacement h(x,y), also denoted h($\vec{x}$), where $\vec{x}$ =(x,y) is a vector in the x-y plane, over an area of the x-y plane and dividing by the area for an area sufficiently large compared to an average spacing between peaks in h(x,y) so that the ratio of the magnitude squared of the Fourier transform to the area is approximately independent of the area. The PSD at a wavevector, $\vec{k}$, (also denoted k), can be expressed as $$PSD(\vec{k}) = \frac{1}{A}\left|\int_A d^2x \ e^{-i\vec{k}\cdot\vec{x}}h(\vec{x})\right|^2$$

for sufficiently large area, A. Typically, the average spacing is less than 1 micrometer and a square area 10 micrometers by 10 micrometers is a sufficiently large area for determining the PSD. PSDs have units of length to the fourth power. It follows from the definition of the PSD that the two-dimensional Fourier space integral of the PSD is equal to $(2\pi)^2$ times the variance Var of the displacement from the mean displacement of the nanostructured interface. It has been found that utilizing the substantially azimuthally symmetric power spectral densities described herein are useful for providing a desired color correction without significantly altering on-axis output (e.g., brightness, color and contrast) of the OLED display when the PSD is suitably chosen.

Figure 2:
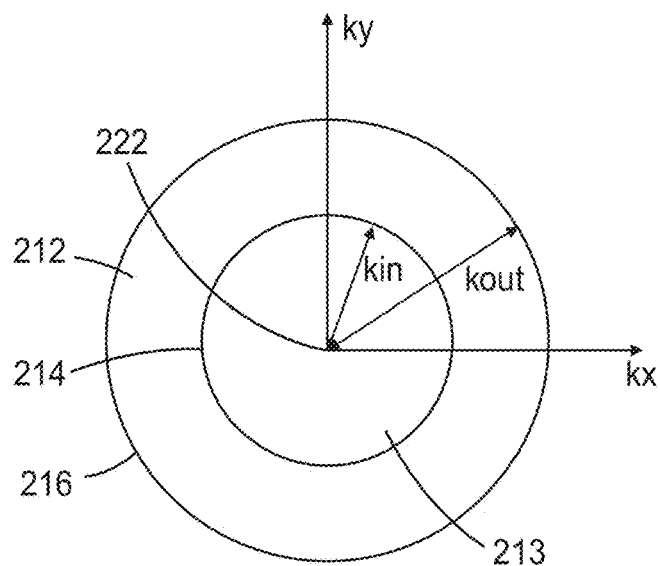
FIG. 2 is a schematic illustration of a region in Fourier space in which the power spectral density (PSD) of a nanostructured interface is concentrated.

FIG. 2 is a schematic illustration of a region in Fourier space in which the power spectral density (PSD) of a nanostructured interface is concentrated. Annulus 212 is a two-dimensional region in Fourier space bounded by inner circle 214 and outer circle 216, both of which are centered at zero wavenumber 222. Inner circle 214 has a radius of kin, which may be described as the inner wavenumber of the annulus 212, and outer circle 216 has a radius of kout, which may be described as the outer wavenumber of the annulus 212. The integral of the PSD over all of Fourier space is $(2\pi)^2$ times the variance Var, which is described elsewhere herein. In some embodiments, the integral in Fourier space of the PSD over the area 213 contained in and bound by the circle 214 is no more than 4 times Var, or no more than 2 times Var, or no more than Var. In some embodiments, the integral of the PSD over the two-dimensional annulus 212 in Fourier space is between 0.8 and 1.0 times $(2\pi)^2$ times Var (i.e., at least 0.8 $(2\pi)^2$ Var and no more than $(2\pi)^2$ Var), or between 0.9 and 1.0 times $(2\pi)^2$ times Var. In some embodiments, the integral of the PSD over the two-dimensional annulus 212 in Fourier space is about $(2\pi)^2$ times Var (e.g., within 5 percent of $(2\pi)^2$ times Var). In some embodiments, kin is 6 radians/micrometer times the second refractive index, or 8 radians/micrometer times the second refractive index, or 9 radians/micrometer times the second refractive index, or 10 radians/micrometer times the second refractive index, or 12 radians/micrometer times the second refractive index, or 13 radians/micrometer times the second refractive index, or 14 radians/micrometer times the second refractive index. In some embodiments, kout is 10 radians/micrometer times the sum of the second refractive index and 0.8, or 12 radians/micrometer times the sum of the second refractive index and 0.8, or 13 radians/micrometer times the sum of the second refractive index and 0.8, or 14 radians/micrometer times the sum of the second refractive index and 0.866, or 16 radians/micrometer times the sum of the second refractive index and 0.9. In some embodiments, kin is in a range of $2\pi$ radians/(700 nanometers) times the second refractive index to $2\pi$ radians/(400 nanometers) times the second refractive index. In some embodiments, kin is in a range of $2\pi$ radians/(600 nanometers) times the second refractive index to $2\pi$ radians/(500 nanometers) times the second refractive index. In some embodiments, kout is in a range of $2\pi$ radians/(700 nanometers) times the sum of the second refractive index and 0.8 to $2\pi$ radians/(400 nanometers) times the sum of the second refractive index and 0.9. In some embodiments, kout is in a range of $2\pi$ radians/(600 nanometers) times the sum of the second refractive index and 0.866 to $2\pi$ radians/(500 nanometers) times the sum of the second refractive index and 0.866. In some embodiments, the emissive OLED layer includes a plurality of colored subpixels having a shortest center wavelength $\lambda a$, a longest center wavelength, and an intermediate center wavelength as described further elsewhere herein. In some embodiments, kin is $1.6\pi n2/\lambda a$ or $1.8\pi n2/2\lambda a$ or $2\pi n2/\lambda a$ where n2 is the second refractive index. In some embodiments, kout is $2\pi(n2+0.866)/\lambda a$ or $2\pi(n2+0.9)/\lambda a$ or $2.2\pi(n2+0.9)/\lambda a$ or $2.2\pi(n2+1)/\lambda a$. In some embodiments, kin is at least $1.67\pi n2/\lambda a$ or at least $1.8\pi n2/\lambda a$ or at least $2\pi n2/\lambda a$, and kout is no more than $2.2\pi(n2+1)/\lambda a$ or no more than $2.2\pi(n2+0.9)/\lambda a$ or no more than $2.2\pi(n2+0.9)/\lambda a$ or no more than $2\pi(n2+0.9)/\lambda a$. In some embodiments, kin is in a range of $1.8\pi n2/\lambda a$ to $2\pi n2/\lambda a$ and kout is in a range of $2\pi(n2+0.9)/\lambda a$ to $2.2\pi(n2+0.9)/\lambda a$.

Any point in Fourier space away from the origin defines a wavevector from the origin to the point. The wavevector of light propagating in a medium is a unit vector in the propagation direction times the refractive index of the medium times $2\pi$ divided by the free-space wavelength of the light. The magnitude of a wavevector is referred to as a wavenumber. As used herein, wavevectors and wavenumbers are expressed in radians per unit length even if the radians are not explicitly stated. The PSD is a function of a two-dimensional wavevector and when the PSD is azimuthally symmetric, the PSD is a function of a wavenumber. The product of the PSD evaluated at a wavevector and the magnitude of the wavevector will be referred to herein as a wavenumber-PSD product which in general is a function of the wavevector and when the PSD is azimuthally symmetric, the wavenumber-PSD product is a function of the wavenumber.

When light with an incident wavevector is incident in a medium on a nanostructured interface having a displacement h(x,y) with a peak to peak amplitude that is small compared to the wavelength of the incident light in the medium and light with a transmitted wavevector is diffracted by the nanostructured interface, the diffracted power transmitted through the nanostructured interface is approximately proportional to the PSD evaluated at the difference between the horizontal components of the transmitted and incident wavevectors (e.g., the projection of the transmitted and incident wavevectors onto the x-y plane of FIG. 1). Light with an incident wavevector of magnitude $(2\pi/\lambda)(n2)$, where n2 is the refractive index of the second layer (e.g., layer 120) and $\lambda$ is a characteristic wavelength of light from the emissive OLED layer, can diffract into a direction normal to the display if the light is incident on the nanostructured interface at a high incidence angle (so that the horizontal projection of the incident wavevector has a magnitude of approximately $(2\pi/\lambda)(n2)$) with a transmitted diffracted power proportional to the PSD evaluated at $(2\pi/\lambda)(n2)$. Since it is often desired for the light output normal to the display to be substantially unaltered by the presence of the nanostructured interface, it may be desired for kin to be no less than $(2\pi/\lambda)(n2)$. As described further elsewhere herein, in some cases it may be desired that the nanostructured interface does not significantly alter the light output for view angles in air relative to the normal to the display less than a certain angle $\varphi$. In such cases, it may be desired for kin to be no less than $(2\pi/\lambda)(n2+\sin \varphi)$.

The PSD at wavenumbers between kin and kout provide a gradual increase in diffractive transmission for increasing view angles relative to the normal to the display since the area in Fourier space contributing to diffractive transmission gradually increases. It has been found that this gradual increase in diffractive transmission provides a gradual increase in color mixing which results in improved color uniformity. Light incident on the nanostructured interface with a wavevector having a horizontal component with a magnitude larger than $(2\pi/\lambda)(n2+\sin \theta)$ cannot diffract into a view angle less than $\theta$ degrees relative to the normal to the display. If $\theta$ is the maximum view angle (e.g., the half-angle of the view cone of the display which may be 60 degrees, for example), then the portion of the PSD with wavenumbers above $(2\pi/\lambda)(n2+\sin \theta)$ do not significantly contribute to diffractive transmission into the view cone of the display. Accordingly, in some embodiments, kout is no more than $(2\pi/\lambda)(n2+\sin \theta)$.

The characteristic wavelength $\lambda$ chosen to determine kin may be different from that chosen to determine kout. For example, the characteristic wavelength for determining kin may be based on the wavelengths of red emitters in the OLED display while the characteristic wavelength for determining kout may be based on the wavelengths of blue emitters in the OLED display. This may be done to ensure that the nanostructured interface provides the desired color mixing effect for all colors in the view cone of the display. In other embodiments, it may be advantageous for one color to be diffracted more than the other colors and the characteristic wavelength $\lambda$ may be taken to be the wavelength for that color in determining both kin and kout. In some embodiments, the characteristic wavelength $\lambda$ chosen to determine both kin and kout is the shortest center wavelength of the colored subpixels of an OLED display.

Figure 3A:
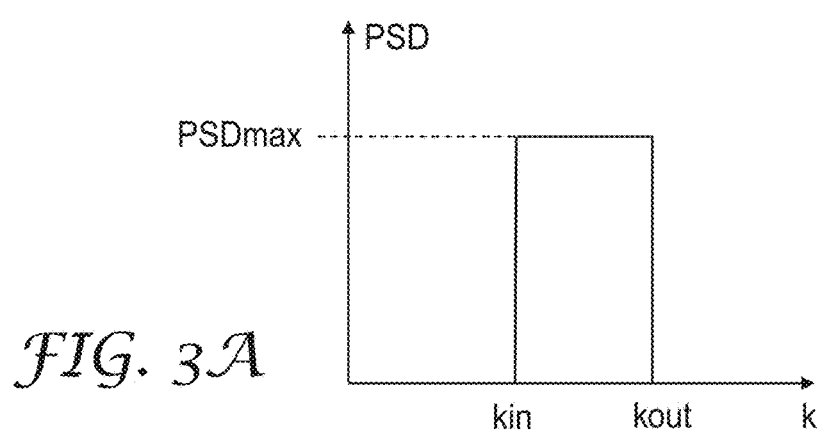
FIG. 3A is a schematic illustration of a PSD of a nanostructured interface as a function of wavenumber.
Figure 3B:
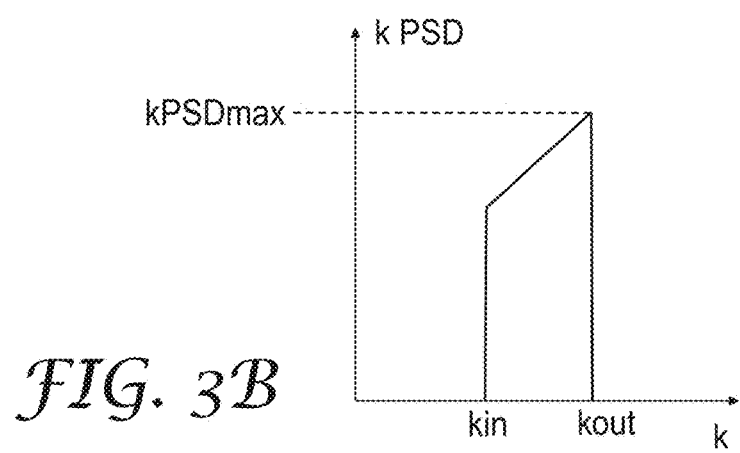
FIG. 3B is a schematic illustration of a wavenumber-PSD product of a nanostructured interface as a function of wavenumber.

FIG. 3A is an idealized schematic illustration of the PSD of a nanostructured interface as a function of wavenumber. In this idealized case, the PSD is non-zero only between kin and kout and it has a constant magnitude in this wavenumber range equal to the maximum value of PSDmax. In other cases, the PSD may not be zero for wavenumbers k less than kin, may not be constant for k between kin and kout, and may not be zero for k greater than kout. The diffracted power through the nanostructured interface is determined by a two-dimensional integral in Fourier space over an integrand proportional to the PSD. This two dimensional integral has a differential area element $d^2k$ which is given by k dk d$\varphi$ in polar coordinates with angular coordinate $\varphi$. Therefore, the diffracted power through the nanostructured interface is determined by an integral over wavenumber and angular coordinate of an integrand proportional the product of the wavenumber and the PSD evaluated at a wavevector having the magnitude of the wavenumber. This product is referred to as the wavenumber-PSD product. FIG. 3B is an idealized schematic illustration of the wavenumber-PSD product (denoted kPSD) of a nanostructured interface as a function of the wavenumber. The wavenumber-PSD product kPSD has a maximum value of kPSDmax.

Figure 4A:
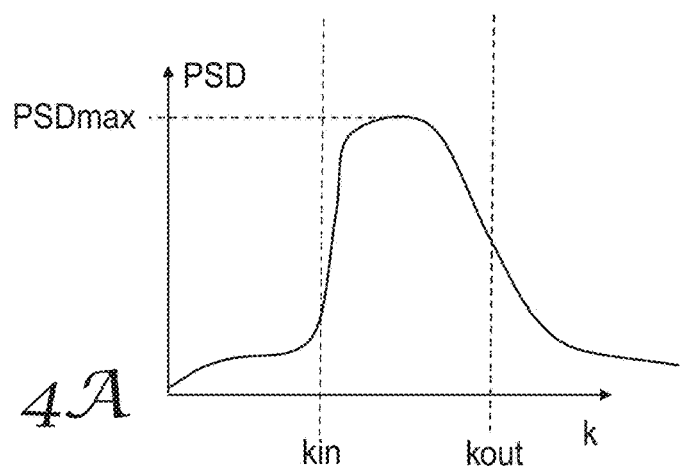
FIG. 4A is a schematic illustration of a PSD of a nanostructured interface as a function of wavenumber.
Figure 4B:
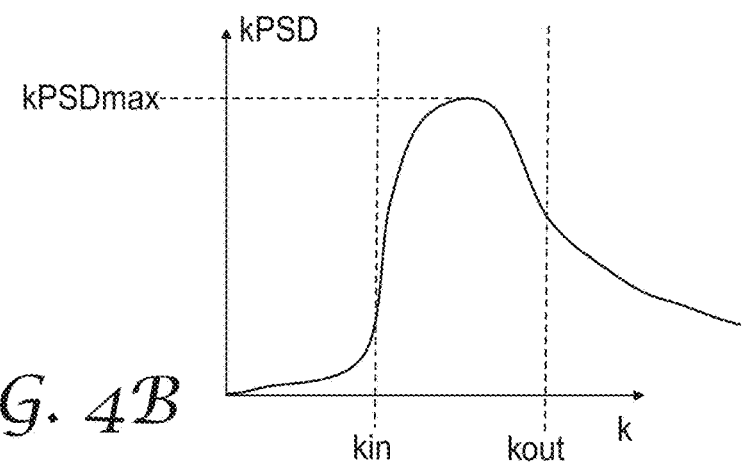
FIG. 4B is a schematic illustration of a wavenumber-PSD product of a nanostructured interface as a function of wavenumber.

FIG. 4A is a schematic illustration of the PSD of another nanostructured interface as a function of wavenumber. The PSD has a maximum, PSDmax, occurring for a wavenumber which is larger than kin and which is smaller than kout. In some embodiments, the wavenumbers kin and kout are taken to be points on either side of the maximum PSDmax where the PSD is 0.5, or 0.3, or 0.2, or 0.1 times its maximum value. In some embodiments, the wavenumbers kin and kout are taken to be points on either side of the maximum kPSDmax where the kPSD is 0.5, or 0.3, or 0.2, or 0.1 times its maximum value. FIG. 4B is a schematic illustration of the product of the wavenumber and the PSD of a nanostructured interface (the wavenumber-PSD product denoted kPSD) evaluated at the wavenumber as a function of the wavenumber. The wavenumber-PSD product kPSD has a maximum value of kPSDmax. In some embodiments, for all wavenumbers less than kin, the PSD is no more than 0.5 times PSDmax, or no more than 0.3 times PSDmax, or no more than 0.2 times PSDmax, or no more than 0.1 times PSDmax. In some embodiments, for all wavenumbers less than kin, the wavenumber-PSD product is no more than 0.3 times kPSDmax, or no more than 0.2 times kPSDmax, or no more than 0.1 times kPSDmax, or no more than 0.05 times kPSDmax. In some embodiments, the preceding ranges hold when the PSD and the wavenumber-PSD product are replaced with their respective annularly averaged values, which is described elsewhere herein, and when PSDmax is replaced with the maximum of the annularly averaged PSD and kPSDmax is replaced with the maximum of the annularly averaged wavenumber-PSD product.

In some embodiments, the two-dimensional integral in Fourier space over the annulus between kin and kout is between 0.8 and 1.0 times $(2\pi)^2$ times Var where Var is the variance of the displacement from the mean displacement of the nanostructured interface. In some embodiments, the two-dimensional integral in Fourier space over the area in the circle having a radius kin and over the region outside a circle having a radius of kout totals no more than 0.2 times $(2\pi)^2$ times Var.

In some embodiments, the PSD is concentrated between kin and kout, but there is substantial contribution (e.g., the PSD may be above 0.05 times PSDmax, or above 0.1 times PSDmax) from wavenumbers larger than kout. This can result from using a tool, as described elsewhere herein, in forming the nanostructured interface where the tool has abrupt changes in height resulting in high wavenumber contributions to the PSD. It is believed that such long wavenumber contributions typically do not significantly affect the color output uniformity of an OLED display including the nanostructured interface.

An average of a quantity (e.g., PSD or wavevector-PSD product) over a region in Fourier space refers to the integral of the quantity over the region divided by the area of the region. An annular average of a PSD (or a wavenumber-PSD product) at a wavenumber is an average of the PSD (or the wavenumber-PSD) product over an annulus in Fourier space having an inner radius of 0.9 times the wavenumber and an outer radius of 1.1 times the wavenumber. In some embodiments, an annular average of the PSD has a maximum for a wavenumber larger than kl times the second refractive index, and the PSD is no more than 0.1, or 0.2, or 0.3 times the maximum annular average for wavenumbers less than k1 times the second refractive index, for at least one k1 in a range of 6 to 9 radians/micrometer. In some embodiments, an annular average of the wavenumber-PSD product has a maximum for a wavenumber larger than k1 times the second refractive index, and the wavenumber-PSD product is no more than 0.1, or 0.2, or 0.3 times the maximum annular average for wavenumbers less than k1 times the second refractive index, for at least one k1 in a range of 6 to 9 radians/micrometer.

The wavenumbers kin and kout of FIGS. 3 and 4 may take any of the values described elsewhere herein in connection with FIG. 2.

Figure 5:
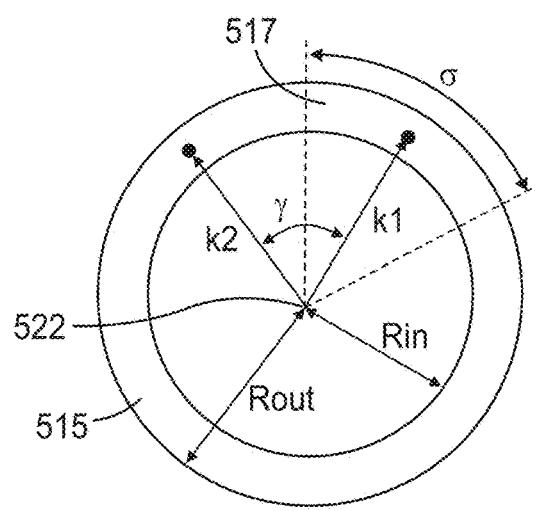
FIG. 5 illustrates an annular sector and an annulus in Fourier space.

FIG. 5 illustrates an annulus 515 including an annular sector 517 useful in describing substantial azimuthal symmetry. The annulus 515 and annular sector 517 are determined by a first wavevector k1 having a first magnitude k1. The annulus 515 is the region in Fourier space bounded by an inner radius Rin of 0.9 times the first magnitude k1 and an outer radius Rout of 1.1 times the first magnitude k1. The annulus 515 is centered on the zero wavenumber 522. The annular sector 517 is centered on the first wavevector k1 and has a subtended angle of σ. The annular sector is a portion of the annulus 515 extending an azimuthal angle of one half σ on either side of k1. As used herein, a power spectral density is substantially azimuthally symmetric if for any first wavevector k1 having a first magnitude k1 between 10 radians/micrometer times the second refractive index and 13 radians/micrometer times a sum of the second refractive index and 0.8, a maximum difference between a local average of the power spectral density at the first wavevector k1 is between 0.67 and 1.33 times the annular average of the power spectral density at the first wavevector k1, where the local average is an average of the power spectral density over an annular sector 517 in Fourier space centered on the first wavevector k1 and having an inner radius Rin of 0.9 times the first magnitude, an outer radius Rout of 1.1 times the first magnitude k1, and a subtended angle of σ, where the annular average is an average of the power spectral density over an annulus 515 in Fourier space having an inner radius Rin of 0.9 times the first magnitude k1 and an outer radius Rout of 1.1 times the first magnitude k1, and where σ is equal to 60 degrees.

In some embodiments, for any first wavevector k1 having a first magnitude k1 between 10 radians/micrometer times the second refractive index and 13 radians/micrometer times a sum of the second refractive index and 0.8, the maximum difference between the local average of the power spectral density at the first wavevector k1 is between 0.7 and 1.3 times, or between 0.8 and 1.2 times, or between 0.9 and 1.1 times the annular average of the power spectral density at the first wavevector k1.

In some embodiments, the PSD is still substantially azimuthally symmetric when a smaller annular sector is used in determining whether the PSD is substantially azimuthally symmetric. For example, in some embodiments, the PSD is substantially azimutally symmetric when the subtended angle σ is equal to 30 degrees.

The range between 10 radians/micrometer times the second refractive index and 13 radians/micrometer times a sum of the second refractive index and 0.8 is used in defining substantially azimuthal symmetry since it has been found that the resulting color uniformity provided by the nanostructure interface is typically more sensitive to this range than other ranges. The PSD may also be approximately azimuthally symmetric within a broader wavenumber range. In some embodiments, for any first wavevector k1 having a first magnitude k1 between 6 radians/micrometer times the second refractive index, or 8 radians/micrometer times the second refractive index, or 10 radians/micrometer times the second refractive index and 13 radians/micrometer times a sum of the second refractive index and 0.8, or 14 radians/micrometer times a sum of the second refractive index and 0.9, a maximum difference between a local average of the power spectral density at the first wavevector k1 is between 0.7 and 1.3, or between 0.8 and 1.2, times the annular average of the power spectral density at the first wavevector k1, where the local average is an average of the power spectral density over an annular sector 517 in Fourier space centered on the first wavevector k1 and having an inner radius Rin of 0.9 times the first magnitude, an outer radius Rout of 1.1 times the first magnitude k1, and a subtended angle of σ, where the annular average is an average of the power spectral density over an annulus 515 in Fourier space having an inner radius Rin of 0.9 times the first magnitude k1 and an outer radius Rout of 1.1 times the first magnitude k1, and where σ is equal to 60 degrees or equal to 30 degrees.

The PSD may have some degree of azimuthal variability and still be considered substantially azimuthally symmetric. In some embodiments, a substantially azimuthally symmetric PSD has an n-fold symmetry axis. This means that the PSD has the same value for any two wavevectors having a common magnitude that separated by an angle of 360 degrees divided by n. For example, the wavevectors k1 and k2 of FIG. 5 have a same magnitude k1 and are separated by an angle γ. If a PSD has a common value at any two such pairs of wavevectors and if γ is 360 degrees divided by n, the PSD may be described as having an n-fold symmetry. In some embodiments, a substantially azimuthally symmetric power spectral density has at least a 6-fold rotation symmetry.

Figure 6:
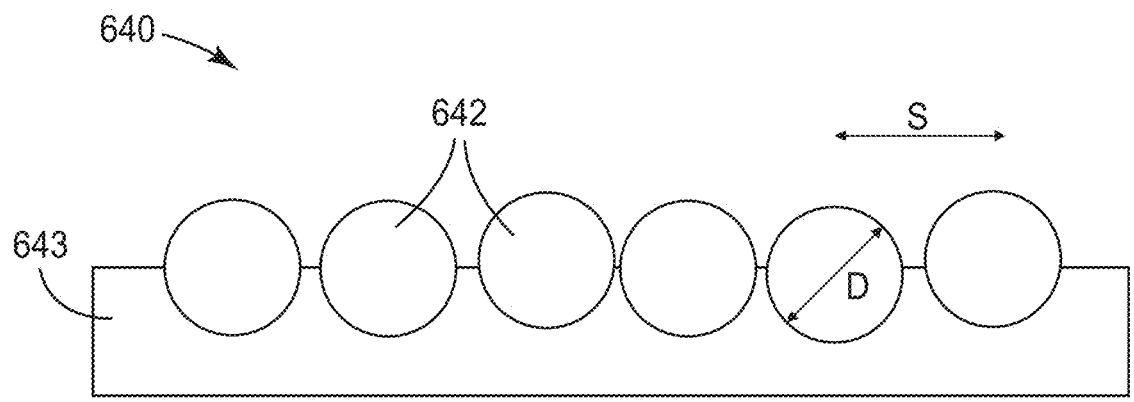
FIG. 6 is a schematic illustration of a tool for making a nanostructured interface.

Nanostructured interfaces having the power spectral densities described elsewhere herein can be made using a tool having a nanostructured surface. FIG. 6 is a schematic illustration of a tool 640 for making a nanostructured interface. Tool 640 includes a plurality particles 642 partially embedded in substrate 643. Useful techniques for making tool 640 are described in U.S. Pat. Appl. No. 2014/0193612 (Yu et al.) and U.S. Pat. No. 8,460,568 (David et al.), which are hereby incorporated herein by reference to the extent they do not contradict the present description. The nanostructured surface of the tool can be characterized by atomic force microscopy (AFM) and this can be used to determine the PSD of the surface via fast Fourier transform, for example. In brief summary, tool 640 can be made by disbursing particles 642 in a polymeric precursor matrix to form a layer. The layer is then dried or cured. This can be done by applying heat to evaporate a solvent or applying actinic radiation to cure the layer. In some cases, the layer is heated to remove solvent and then actinic radiation is applied to cure the layer. The layer can then be etched (e.g., reactive ion etched) to form the tool 640. The tool 640 can then be used to form a nanostructured surface in a first layer which can then be backfilled to form an optical stack having a nanostructured interface. The nanostructured surface can be formed in a continuous cast and cure process where a resin is cast against the tool 640 and cured, for example, with actinic (e.g., ultraviolet) radiation or heat. Examples of continuous cast and cure processes are described in the following patents, all of which are incorporated herein by reference to the extent that they do not contradict the present description: U.S. Pat. Nos. 4,374,077; 4,576,850; 5,175,030; 5,271,968; 5,558,740; and 5,995,690.

The tool 640 produces a nanostructured interface having an average spacing S. The particles 642 are typically randomly agglomerated and so the particles 642 are typically not on a periodic lattice. The average spacing of a nanostructured interface can be defined as an average peak to peak nearest neighbor distance, which in the case of the tool 640 corresponds to an average center to center distance between neighboring particles. The particles have an average size D. In the case of monodispersed spherical particles this is the diameter of the particles. In other cases, the average size D is determined from the average volume V of the particles (unweighted arithmetic average over the particles used in forming the nanostructured interface) as $D=(6V/\pi)^{1/3}$.

Utilizing a sufficiently high loading of particles in the layer results in a substantially azimuthally symmetric PSD for the nanostructured interface since the particles randomly agglomerate in an approximately azimuthally symmetric way. The size of the particles, D, and the loading of the particles, or the resulting average center to center spacing, S, of the particles, can be selected to determine the wavenumbers kin and kout illustrated in FIGS. 4 and 5. Typically, choosing a high loading of the particles will result in a PSD substantially azimuthally symmetric and localized in a thin region in Fourier space (kout not much greater than kin). A high loading means that when the tool 640 is formed the particles 642 are nearly closely packed in a layer. Reducing the particle loading increases S and moves the wavenumber kin to smaller values. Generally, the wavenumber kout is inversely proportional to the size D of the particles and the wavenumber kin is inversely proportional to the spacing S between particles. Thus by selecting the length scales D and S for the tool 640, a nanostructured surface can be made that has a substantially azimuthally symmetric PSD that is concentrated between kin and kout as in FIG. 4, for example.

Figure 7:
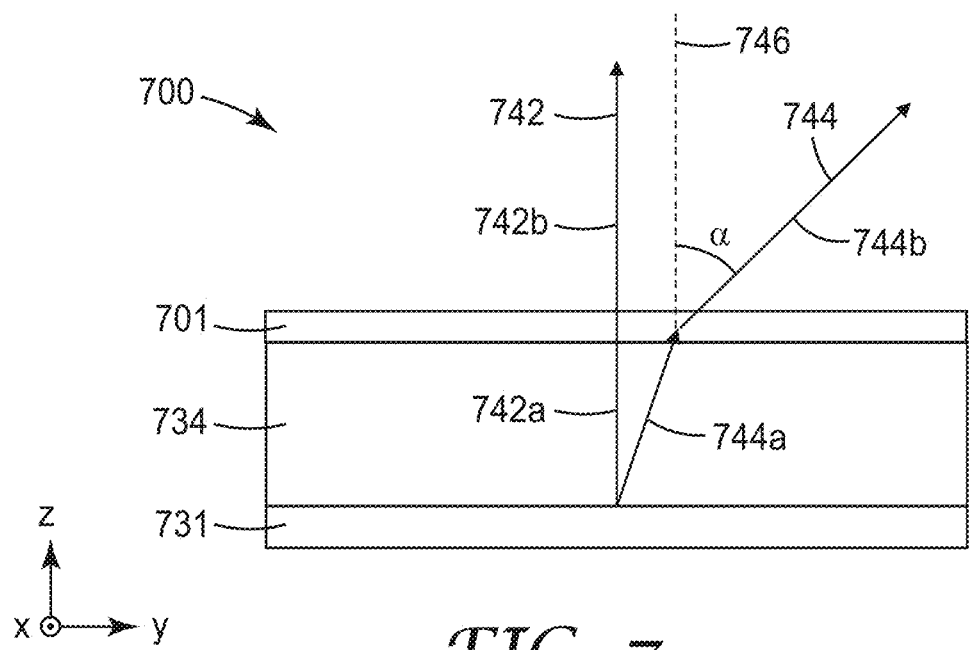
FIG. 7 is a cross-sectional view of an OLED display.

In some embodiments, when the tool 640 is etched to form the nanostructured interface, post-like structures with the particles 642 and the top of the posts are formed. Such post-like structures give high wavenumber contributions to the resulting PSD. These high wavenumber contributions are believed to not significantly affect the color uniformity performance of the OLED displays incorporating the resulting nanostructured interfaces. The height of the posts can be controlled by the etching process. Reducing the heights reduce the high wavenumber contribution to the PSD and so increases the PSD between kin and kout. FIG. 7 is a cross-sectional view of an OLED display 700 including an optical stack 701 having a nanostructured interface (as illustrated in FIG. 1), an OLED stack 731 including an emissive OLED layer (as illustrated in FIG. 1), and an interior layer 734 which may be an encapsulant layer for the OLED stack 731. Optical stack 701 may include additional layers such as a circular polarizer and a touch sensitive layer, for example FIG. 7 illustrates a first light output 742 at a view angle of zero degrees relative to a normal 746 to the display 700 and a second light output 744 at a view angle of α relative to the normal 746. The view angle α may be 45 degrees and the display may be fully on when various colors and color differences are specified. As used herein, unless specified differently, the view angle refers to the view angle relative to the normal to the display as observed in air external to the display. The first light output 742 has a first color 742a in the interior layer 734 and a second color 742b exterior to the display 700. In some embodiments, the first and second colors 742a and 742b are the same color since the optical stack is configured to not alter the light output at a view angle normal to the display. The second light output 744 has a third color 744a in the interior layer 734 and a fourth color 744b exterior to the display 700.

The first and third colors 742a and 744a have a first chromaticity distance therebetween and the second and fourth colors 742b and 744b have a second chromaticity distance therebetween. As used herein, chromaticity distance refers to the Euclidean distance between two points in the CIE (Commission Internationale de l'Eclairage) 1976 UCS (Uniform Chromaticity Scale) chromaticity diagram. For example, if a first color has CIE 1976 UCS color coordinates $(u'_1, v'_1)$ and a different second color has CIE 1976 UCS color coordinates $(u'_2, v'_2)$, the chromaticity distance between the two colors is given by the positive square root of $(\Delta u'v')^2 = (u'_2 - u'_1)^2 + (v'_2 - v'_1)^2$.

In some embodiments, the nanostructured interface of the optical stack 701 is configured such that the second chromaticity distance is less than 0.75 times, or less than 0.6 times, or less than 0.5 times the first chromaticity distance. As discussed further elsewhere herein, this can be accomplished by choosing kin, referring to FIGS. 3 and 4, sufficiently large so that the first light 742 is not diffracted by the nanostructured interface and choosing the PSD in the region between kin and kout to be approximately uniform so that light propagating in a range of directions in the interior layer 734 can be diffracted into the view angle α. In strong cavity OLEDs, for example, the color in the interior layer 734 varies significantly with propagation direction and diffracting light from a range of propagation directions, and therefore a range of colors, from the interior layer 734 into the view direction specified by the angle cc results in an averaged color at the view angle α. This effect results in reduced color variation with view angle. In some embodiments, the nanostructured interface is configured to provide diffractive transmission for light from the emissive OLED layer in at least some view directions at an angle cc greater than 10 degrees, or greater than 20 degrees, or greater than 30 degrees to normal.

Figure 8A:
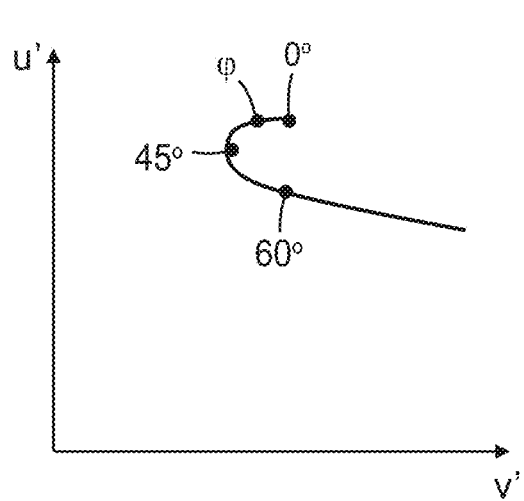
FIG. 8A-8B are plots showing the variation of color output of OLED displays with view angle.
Figure 8B:
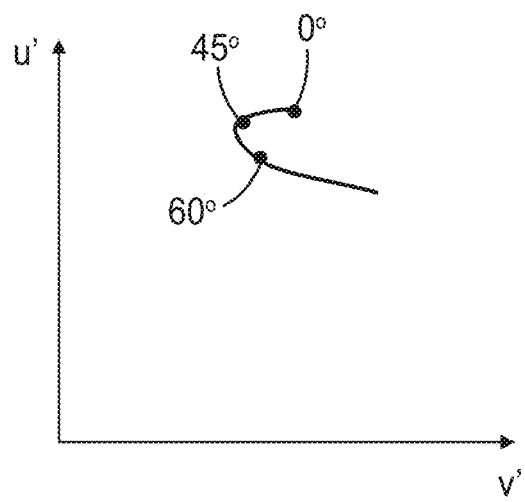

FIG. 8A-8B are schematic CIE 1976 UCS u'v' plots showing the variation of the color output of OLED displays with view angle. FIG. 8A shows the color output of a display not including a nanostructured interface and FIG. 8B shows the color output of the same display when an optical stack having a nanostructured interface is disposed on the display. Points corresponding to view angles in air of 0, 45 and 60 degrees are shown on both plots. The color shift with view angle is substantially reduced when the nanostructured interface is included. In some cases, it may be desired to choose the nanostructured interface so that light within some cone angle is transmitted through the nanostructured interface without diffraction. This cone angle may be described as the highest view angle of the emissive OLED layer where it is desired to preserve a light output of the emissive OLED layer without color correction. This angle is denoted by φ in FIG. 8A. For example, a chromaticity shift of 0.005 may be the largest acceptable color shift and this angle may be in the range from zero degrees to 10 degrees, or to 20 degrees, for example.

It is typically desired that the nanostructured interface has an average spacing between nearest neighbor peaks smaller than the pixel spacing of the OLED display. In some embodiments, the nanostructured interface has an average spacing between nearest neighbor peaks in a range of 100 nm to 350 nm, or in a range of 150 nm to 250 nm.

Figure 9:
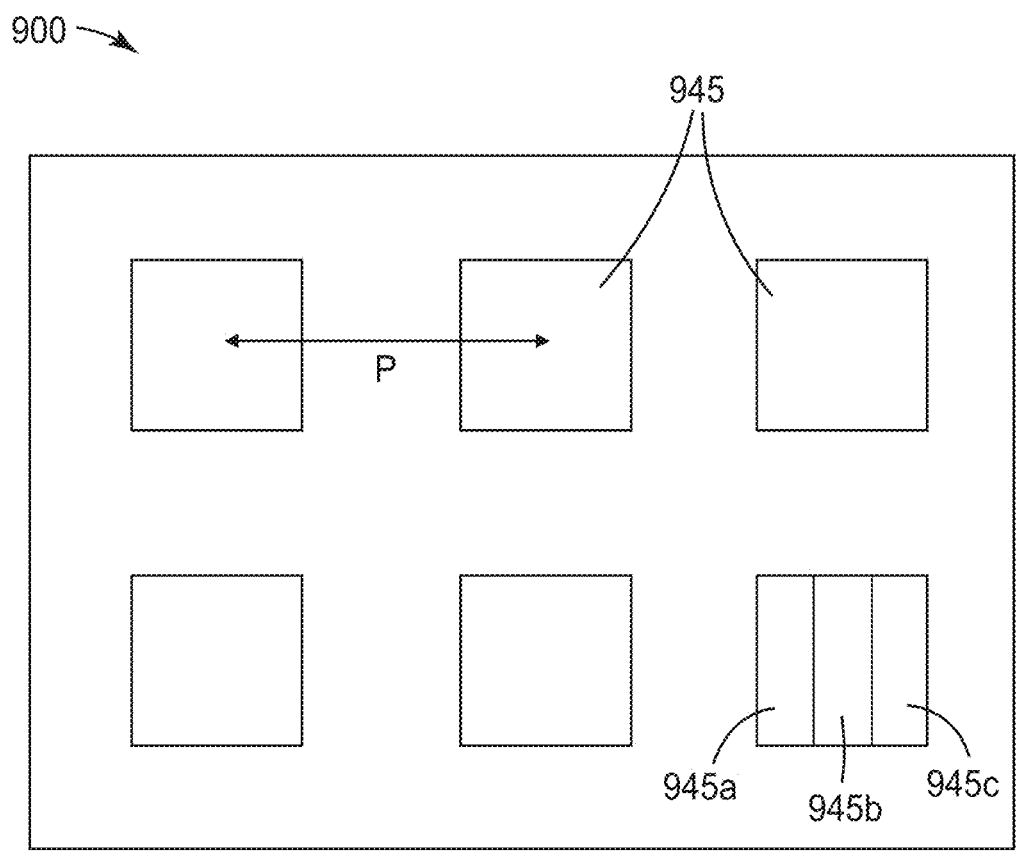
FIG. 9 is a schematic illustration of a pixelated display.

FIG. 9 is a schematic illustration of a pixelated display 900 including a plurality of pixels 945. Each of the pixels 945 typically includes a plurality of subpixels which allow a desired color to be produce by each pixel 945. For example, the illustrated subpixels 945a, 945b and 945c may be blue, green and red subpixels which can have output levels adjustable to provide a desired color and a desired intensity. The pixels 945 have an average pixel spacing P. In some embodiments, the OLED display 900 has an average pixel spacing P and the nanostructured interface has an average spacing between nearest neighbor peaks less than 0.2 times, or than 0.1 times, or less than 0.05 times the average pixel spacing P.

The length scales associated with the tool used to make the nanostructured interface (such as the particle size D and the average spacing S described elsewhere herein) can be selected based, at least in part, on the colors produced by the subpixels of the OLED display.

Figure 10:
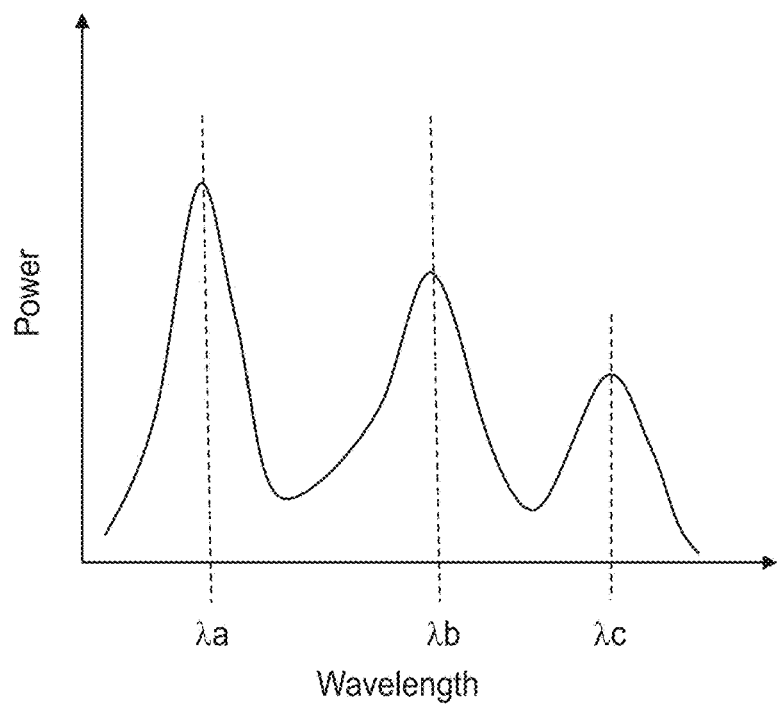
FIG. 10 is a plot of the on-axis spectrum produced by an OLED display.

FIG. 10 is a plot of a spectrum produced by an OLED display as viewed normal (zero view angle) to the display. Three peaks are present corresponding to colors of the subpixels 945a, 945b and 945c. The shortest center wavelength is denoted λa, the longest center wavelength is denoted λc, and an intermediate center wavelength is denoted λb. In some embodiments, at least one of these wavelengths is used in determining a suitable wavenumber kin depicted in FIGS. 3 and 4. In some embodiments, kin is determined as follows: (i) Determine a characteristic wavelength λ of the OLED display. In some embodiments, this wavelength is selected to be the intermediate center wavelength λb at zero view angle of the emissive OLED layer. In some embodiments, this wavelength is selected to be the shortest center wavelength λa at zero view angle of the emissive OLED layer. In other embodiments, a wavelength between the shortest center wavelength λa and the intermediate center wavelength λb is used as the characteristic wavelength λ. The center wavelengths can be determined by measuring the light output of the display at zero view angle or the center wavelengths may be provided by the OLED manufacturer. (ii) Determine a highest view angle, φ, of the emissive OLED layer where it is desired to preserve a light output of the emissive OLED layer without color correction. This can be done by measuring the color spectrum as in FIG. 8A and determining the view angle where the color shift starts to become unacceptable. The largest color shift that is deemed to be unacceptable may depend on the application (e.g., it may be different for hand-held (e.g., cell phones) and television displays). Once a largest acceptable color shift is specified (e.g., a CIE 1976 UCS chromaticity distance of 0.005), the angle φ can be determined from the chromaticity plot as in FIG. 8A. In some embodiments, substantially no color shift is deemed to be acceptable and the angle φ is zero. (iii) Determine a length scale, L, as the characteristic wavelength, λ, divided by a sum of the second refractive index, n2, and a sine of the highest view angle $(L = \lambda/(n2 + \sin(\varphi)))$. The wavenumber corresponding to kin is then $2\pi/L$.

In some embodiments, a wavenumber corresponding to kout, is also determined prior to forming the nanostructured interface. This can be determined as follows: (i) Determine a half-angle θ of the view cone of the display. This can be determined as a manufactured specification or simple as a specified maximum view angle of interest for a particular display application. (ii) Determine the shortest center wavelength λa at zero view angle of the emissive OLED layer. This can be done by measuring the light output of the display at zero view angle or the shortest center wavelength λa may be provided by the manufacturer of the emissive OLED layer. In other embodiments, one of the other center wavelengths λb or λc is determined and used in determining kout. In some embodiments, the characteristic wavelength used in determining kin is also used in determining kout. (iii) Determining a second length scale, L2, as the center wavelength, λa, divided by a sum of the second refractive index, n2, and a sine of the half-angle $\theta(L2 = \lambda a/(n2 + \sin(\theta)))$. In other embodiments, the characteristic wavelength used in determining kin is used in determining the second length scale L2, or one of the other center wavelengths λb or λc may be used in determining the second length scale L2, or some other wavelength between λa and λc may be used. The wavenumber corresponding to kout is then 2π/(L2).

After the length scale L, and optionally the second length scale L2 are determined, a nanostructured interface having a substantially azimuthally symmetric power spectral density is formed such that an integral of the power spectral density of the nanostructured interface over an area contained in and bounded by a circle in Fourier space centered at zero wavenumber and having a radius of 6 radians divided by the length scale L is no more than 4 times a variance in displacement from a mean displacement of the nanostructured interface. The nanostructured interface can be formed using a tool and a cast and cure process as described further elsewhere herein. In some embodiments, the power spectral density has a maximum for a wavenumber larger than 6 radians divided by the length scale L and the power spectral density is no more than 0.3 times, or 0.2 times, or 0.1 times the maximum for wavenumbers less than 6 radians divided by the length scale L. In some embodiments, a wavenumber-PSD product has a maximum for a wavenumber larger than 6 radians/micrometer times the second refractive index, and for all wavenumbers less than 6 radians/micrometer times the second refractive index, the wavenumber-PSD product is no more than 0.3 times the maximum, or no more than 0.2 times the maximum, or no more than 0.1 times the maximum. In some embodiments, the maximum in the power spectral density occurs at a wavenumber larger than $2\pi$ divided by the length scale L and the power spectral density is no more than 0.3 times, or no more than 0.3 times, or no more than 0.1 times the maximum for wavenumbers less than $2\pi$ divided by the length scale L. In some embodiments, an integral of the power spectral density over a two-dimensional annulus in Fourier space is between 0.8 and 1.0 times $(2\pi)^2$ times a variance in displacement from a mean displacement of the nanostructured interface. In some embodiments, the annulus has an inner wavenumber of 9 radians/micrometer times the second refractive index and an outer wavenumber of 16 radians/micrometer times the sum of the second refractive index and 0.9. In some embodiments, the annulus has an inner wavelength of kin and an outer wavelength of kout where kin and kout can take any of the values described elsewhere herein (e.g., kin may be in a range of $1.8\pi n2/\lambda a$ to $2\pi n2/\lambda a$ and kout may be in a range of $2\pi(n2+0.9)/\lambda a$ to $2.2\pi(n2+0.9)/\lambda a$).

Figure 11:
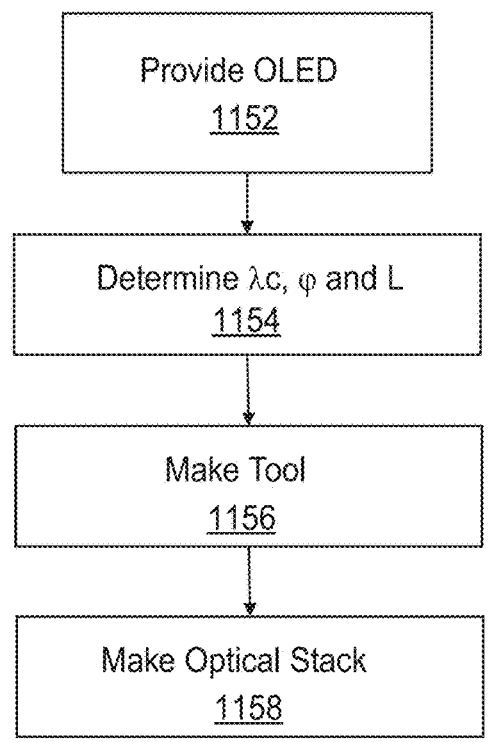
FIG. 11 is a flow chart illustrating a method of reducing variation of color with view angle in an OLED display.

FIG. 11 is a flow chart summarizing a method of reducing variation of color with view angle in an OLED display. In step 1152, an encapsulated emissive OLED layer is provided. In step 1154, the characteristic center wavelength λ, the highest view angle φ without color correction, and the length scale L are determined as described elsewhere herein. In some embodiments, the shortest center wavelength λa, the half-angle θ, and the second length scale L2 are also determined. In step 1156, a tool used to make a nanostructured interface is provided. The tool can be made using particles disbursed in a layer and using reactive ion etching, for example, as described further elsewhere herein (see, e.g., FIG. 6), and the parameters L, λ, φ, and optionally L2 and θ, can be used in determining the particle size and loading in making the tool. In step 1158, an optical stack including the nanostructured interface is made. As described further elsewhere herein, the optical stack can be made by casting and curing a first layer against the tool to form a nanostructured surface. The nanostructured surface can then be backfilled with a backfill material to form the optical stack. The optical stack can then be used to reduce color variation in the OLED display by disposing the optical stack on the encapsulated emissive OLED layer. In some embodiments, the optical stack is laminated to the encapsulated emissive OLED layer through an optically clear adhesive, for example.

EXAMPLES

Comparative Example C1

Figure 12:
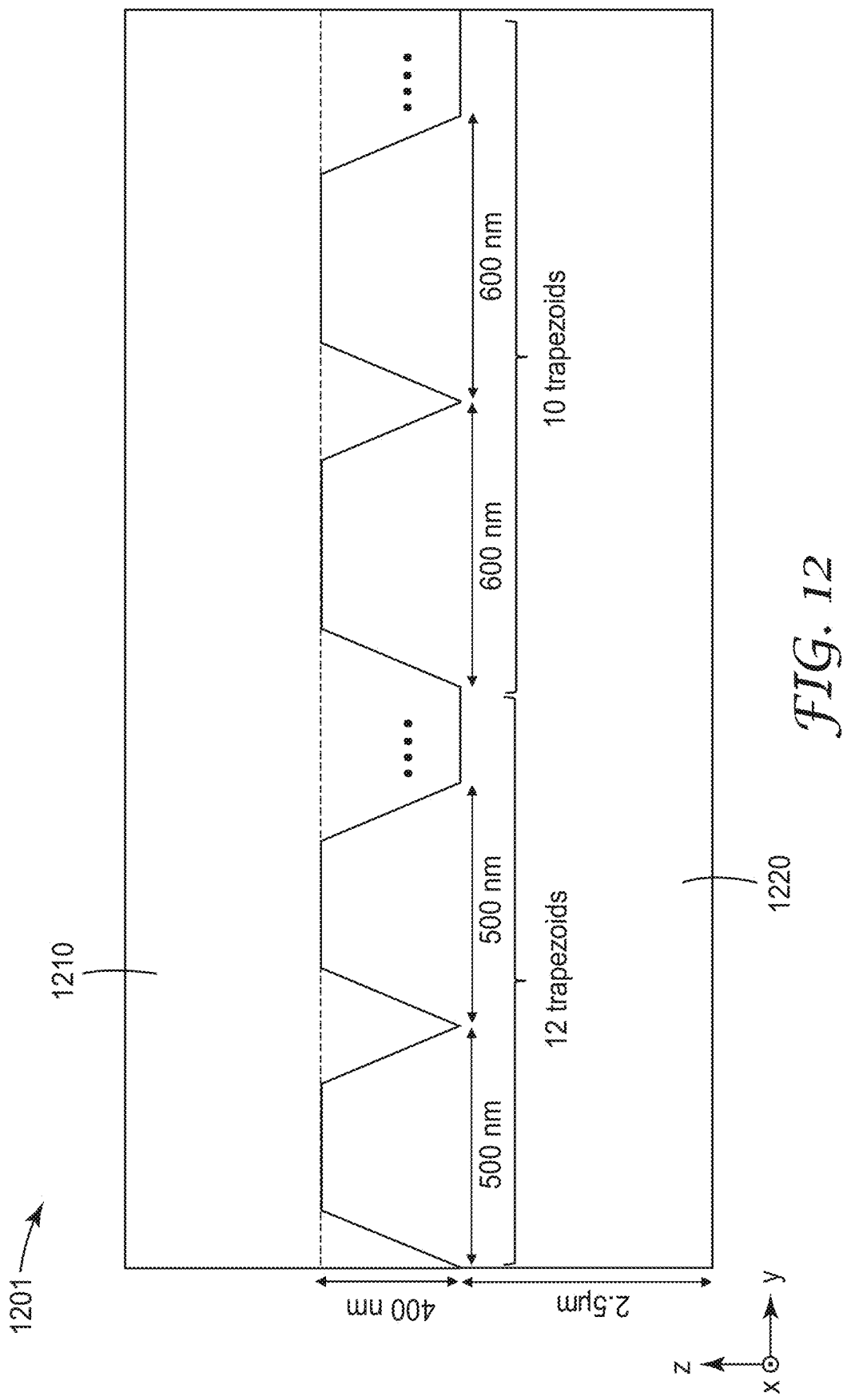
FIG. 12 is an illustration of an optical stack of Comparative Example C1.

The two-dimensional periodic optical stack 1201 illustrated in FIG. 12 was modeled. The profile depicted in FIG. 12 extends in both the x- and y-dimensions. The profile consisted of repeats of 22 contiguous 400 nm high isosceles trapezoids. The first twelve of these possessed 500 nm bases; the next ten possessed 600 nm bases. The first layer 1210 was modeled as a resin layer having a refractive index of 1.50 and no absorption. The second layer 1220 was modeled as having a refractive index of 1.85 and an absorption coefficient of 0.025 $\mu m^{-1}$. The second layer 1220 extended to a plane 2.5 µm beneath the bases of the trapezoids.

Figure 13:
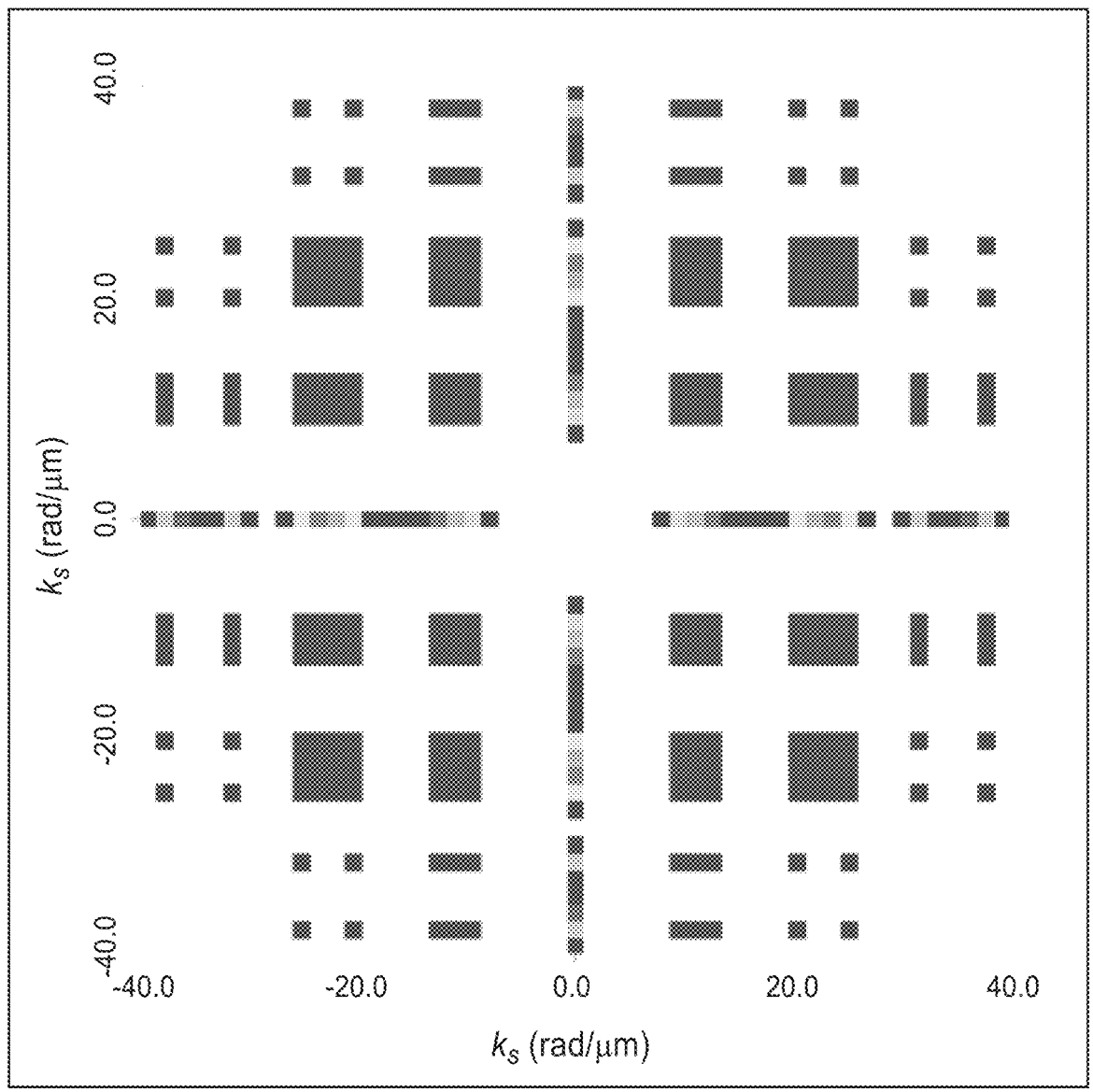
FIG. 13 is a contour plot of the power spectral density of the interface of FIG. 12.

FIG. 13 depicts the power spectral density of the interface between the first and second layers 1210 and 1220. The amplitude of the power spectral density is depicted as a function of the Cartesian components of the wavevector. The power spectral density is not substantially azimuthally symmetric. The form is similar to a blurred superposition of two square grids possessing spacings equal to 2π/0.5 µm or 2π/0.6 µm. These Fourier grids are as expected for spatial periodicities of 0.5 and 0.6 µm in both x and y, and the blurring is a result of truncating the clusters of trapezoids so as to include only twelve or ten members.

An OLED display having a circular polarizer similar to that in the Samsung Galaxy S6 was modeled with the optical stack 1201 placed between the circular polarizer and the OLED emissive layers of the OLED display. The optical stack 1201 was placed on an encapsulant layer of the OLED display positioned with the mean of its displaced surface 10 µm above the top of the OLED emission stack. The resin layer of the structure and the encapsulant layer were modeled as having the same refractive index so that the second layer 1220 could be considered to be inserted within the medium of the OLED device. The modeling of the OLED emissive layers was as described in U.S. Pat. No. 7,801,716 (Freier), which is hereby incorporated herein by reference to the extent that it does not contradict the present description. The modeling of the optical stack 1201 was done using Bragg theory as generally described in Rice et al., Communications on Pure and Applied Mathematics, Volume 4, pp. 351-378, 1951. In this model, the transmitted diffracted power is proportional to the square of the refractive index difference between the first and second layers 1210 and 1220 and the power spectral density of the interface evaluated at the difference in the horizontal (x-y plane) projection of the incident and transmitted wavevectors. Polarization-dependent ray tracing was used to model the interactions between the OLED emissive layers, the optical stack 1201 and the circular polarizer.

Table 1 summarizes the performance metrics of conoscopic brightness, conoscopic color, ambient reflectance, and emissive contrast, evaluated both with ("with Structure") and without ("Control") the optical stack 1201 depicted in FIG. 12 included.

TABLE 1

| | | | View Direction | | | | | |
| --- | --- | --- | --- | --- | --- | --- | --- | --- |
| | | | | Perpendicular | | | Vertical | |
| | | Axial | 30° | 45° | 60° | 30° | 45° | 60° |
| Brightness | Control | 304 | 222 | 126 | 71 | 230 | 138 | 87 |
| | with Structure | 231 (↓24%) | 169 | 101 | 64 | 174 | 110 | 78 |
| Color | Control | u' = 0.0857 v' = 0.5797 | 0.019 | 0.029 | 0.028 | 0.019 | 0.028 | 0.028 |
| | with Structure | u' = 0.0881 v' = 0.5788 | 0.017 (↓11%) | 0.020 (↓31%) | 0.016 (↓43%) | 0.016 (↓16%) | 0.020 (↓29%) | 0.016 (↓43%) |
| Ambient Reflection | Control | 0.0007 (0.07%) | 0.0019 | 0.0063 | 0.0126 | 0.0028 | 0.0086 | 0.0182 |
| | with Structure | 0.0016 (0.16%) | 0.0033 | 0.0057 | 0.0083 | 0.0037 | 0.0065 | 0.0104 |
| Emissive Contrast | Control 10 μm × 10 μm | 299 (2100:1) | 220 (960:1) | 126 (550:1) | 70 (230:1) | 225 (940:1) | 139 (930:1) | 86 (780:1) |
| | with Structure 100 μm × 100 μm | 234 (210:1) | 164 (82:1) | 99 (50:1) | 61 (19:1) | 169 (89:1) | 108 (54:1) | 74 (21:1) |

The on-axis brightness was reduced by 24% due to the presence of the optical stack 1201. The color is reported as CIE 1976 UCS chromaticity coordinates in the axial view direction and chromaticity distances from this color are given for non-zero view directions. The number in parentheses for the "with Structure" are the percent reductions in the color shift attributable to the structured element.

Ambient reflectance was evaluated by illuminating the device with uniform one-nit Lambertian solar luminance, evaluating the brightness as a function of view direction, and comparing these values to one nit. In the presence of a circular polarizer the dominant contribution is front surface reflection. These are excluded from the evaluations so that the relatively small contribution made by the interior can accurately assessed.

The emissive contrast was evaluated as the average perceived brightness in illuminated squares, divided by the average perceived brightness in dark squares, when a checkerboard was illuminated on the display. It is often desired that the emissive contrast ratio is 1000:1 or larger. The emissive contrast increases with the dimensions of the checkerboard. The emissive contrast of the control exceeds 1000:1 for a 10 μm by 10 μm checkerboard. With the structure present, the emissive contrast exceeds 1000:1 only for 1000 μm by 1000 μm and larger checkerboards. Here, the "with structure" emissive contrasts for a 100 μm by 100 μm checkerboard are reported so as to clearly illustrate the degradation (lower contrast, even for larger checkerboards) induced by the structure.

Example 1

An OLED display was modeled as in Comparative Example C1 except that the optical stack 1201 was replaced with an optical stack having a nanostructured interface with an azimuthally symmetric power spectral density. The indices of refraction and absorption for the first and second layers were as described for Comparative Example C1.

The power spectral density was modeled as shown in FIGS. 2 and 3A with kin given by $(2\pi/\lambda)(2)$ and kout given by $(2\pi/\lambda)(n2+\sin\theta)$ where $\lambda$ was taken to be 530 nm and $\theta$ was taken to be 60 degrees. The amplitude of the nanostructured interface was selected so the variance of the surface displacement from its mean was equal to $(125\ nm)^2$. This variance fixed the value of PSDmax.

TABLE 2

| | | | View Direction | | | | | |
| --- | --- | --- | --- | --- | --- | --- | --- | --- |
| | | | | Perpendicular | | | Vertical | |
| | | Axial | 30° | 45° | 60° | 30° | 45° | 60° |
| Brightness | Control | 304 | 222 | 126 | 71 | 230 | 138 | 87 |
| | with Structure | 278 (↓8%) | 183 | 98 | 54 | 193 | 109 | 66 |
| Color | Control | u' = 0.0857 v' =0.5797 | 0.019 | 0.029 | 0.028 | 0.019 | 0.028 | 0.028 |
| | with Structure | u' = 0.0865 v' = 0.5796 | 0.018 (↓5%) | 0.023 (↓21%) | 0.018 (↓36%) | 0.020 (↓5%) | 0.022 (↓21%) | 0.018 (↓36%) |
| Ambient Reflection | Control | 0.0007 (0.07%) | 0.0019 | 0.0063 | 0.0126 | 0.0028 | 0.0086 | 0.0182 |
| | with Structure | 0.0008 (0.08%) | 0.0019 | 0.0029 | 0.0035 | 0.0025 | 0.0041 | 0.0065 |

TABLE 2-continued

| | | | View Direction | | | | | |
| --- | --- | --- | --- | --- | --- | --- | --- | --- |
| | | | | Perpendicular | | | Vertical | |
| | | Axial | 30° | 45° | 60° | 30° | 45° | 60° |
| Emissive Contrast | Control 10 μm × 10 μm | 299 (2100:1) | 220 (960:1) | 126 (550:1) | 70 (230:1) | 225 (940:1) | 139 (930:1) | 86 (780:1) |
| | with Structure 10 μm × 10 μm | 281 (1400:1) | 179 (99:1) | 96 (34:1) | 50 (16:1) | 186 (120:1) | 106 (37:1) | 63 (18:1) |

Compared to Comparative Example C1, Example 1 showed an improved axial brightness (the reduction in axial brightness due to the nanostructured interface was substantially lower), an improved axial color, an improved internal reflectance which was no larger than that of the control, and an improved axial emissive contrast which even for a 10 μm by 10 μm checkerboard, remained larger than 1000:1.

Tool A

Tool A was an article having particles protruding from a surface of a substrate and was made as generally described in U.S. Pat. Appl. No. 2014/0193612 (Yu et al.) and U.S. Pat. No. 8,460,568 (David et al.). SILQUEST A-174 (available from Momentive Performance Materials Inc. (Waterford, N.Y.)) surface modified $SiO_2$ nanoparticles were disbursed in dipentaerythritol pentaacrylate (resin SR399 available from Sartomer Americas (Exton, Pa.)) at 50 weight percent loading to form a nanoparticle loaded polymeric precursor which was coated onto a polyethylene terephthalate (PET) film and ultraviolet (UV) radiation cured forming a coating containing approximately a monolayer of particles. The particles were approximately spherical with a diameter of 440 nm. The particles were approximately monodispersed but included a smaller number of much smaller particles.

The apparatus and process generally described in U.S. Pat. Appl. No. 2014/0193612 (Yu et al.) and U.S. Pat. No. 8,460,568 (David et al.) were used for etching of the nanoparticle coated PET film using a cylindrical electrode, with the corresponding roll-to-roll cylindrical Reactive Ion Etching (RIE) process. The width of the cylindrical electrode was 42.5 inches (1.08 meters), and its diameter was 20 inches (0.51 meters). Oxygen gas flow rate was maintained at 100 standard $cm^3$/minute, and Rf power was applied at 7500 watts. The process pressure resulting from these conditions was 3-5 mTorr. The nanoparticle coated film was translated with the drum, to provide a residence (etching) time of 60 seconds.

Figure 14:
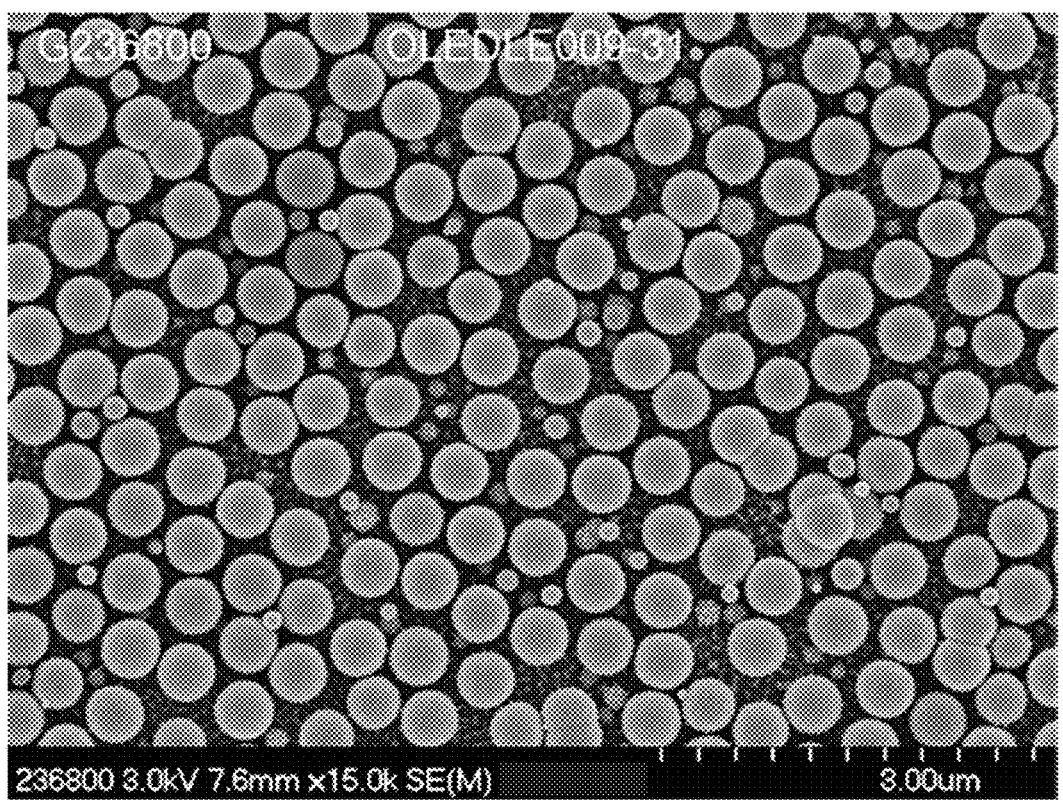
FIG. 14 is an image of a nanostructured surface of a tool.
Figure 15:
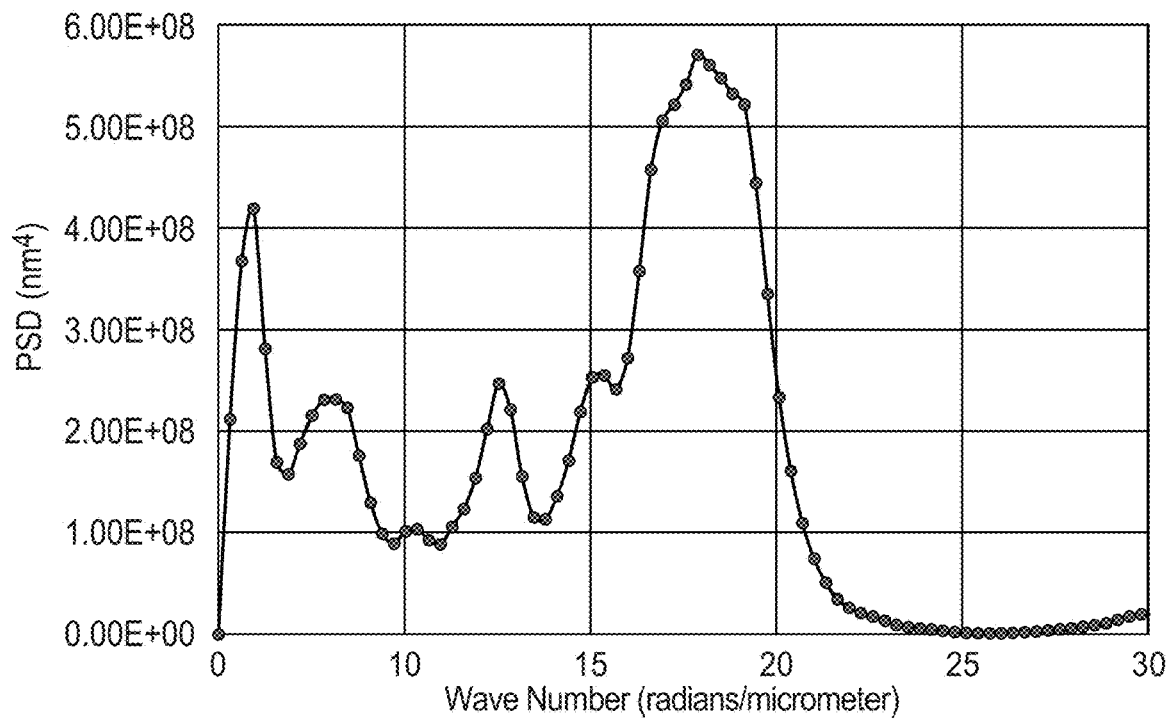
FIG. 15 is a plot of the PSD of the nanostructured surface of the tool of FIG. 14.
Figure 16:
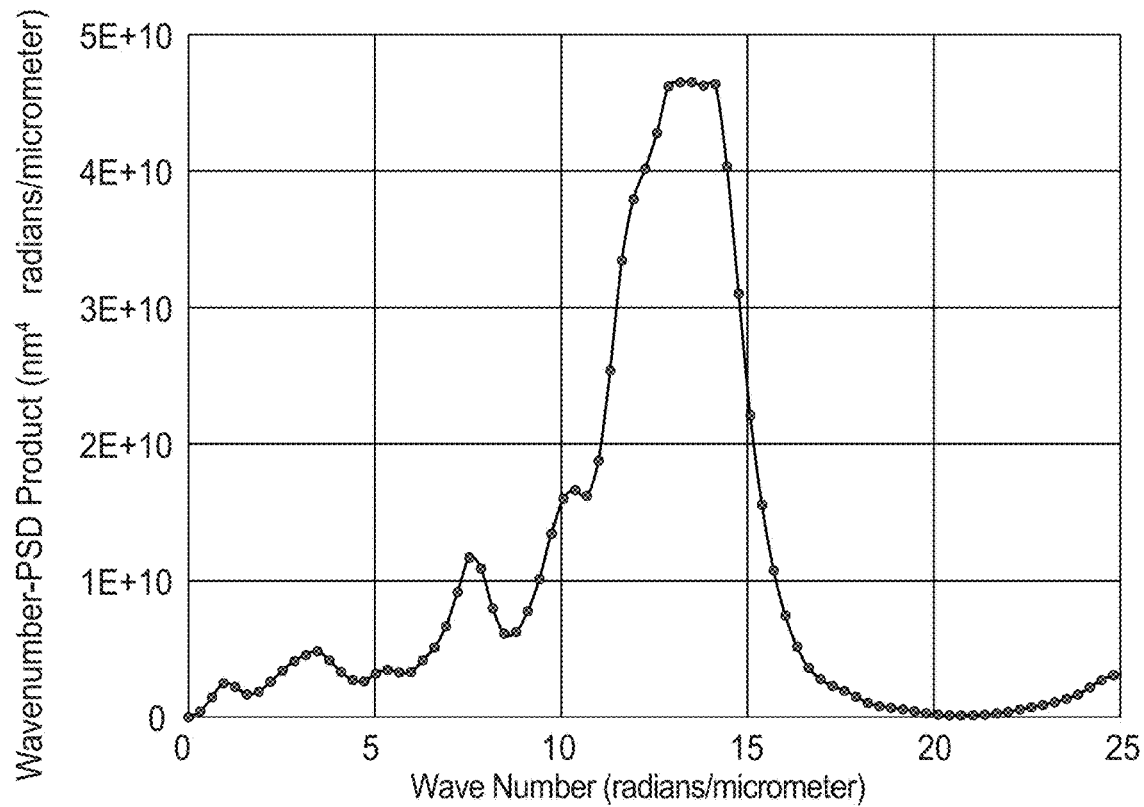
FIG. 16 is a plot of the wavenumber-PSD product of the nanostructured surface of the tool of FIG. 14.

A micrograph of the resulting structured surface of the tool is shown in FIG. 14. The profile of the structured surface was calculated by determining the x-y coordinates of the center point of the particles in the image and from this the displacement h(x,y) from the upper surface of the substrate was determined by assuming that the half of each particle protruded from the surface of the substrate and that the particles were spherical. The sample size analyzed for determining the variance and the PSD of the nanostructured surface was 7.59 micrometers by 5.48 micrometers (for an area of about 41.5 micrometers). The variance, Var, in displacement h(x,y) was determined to be 6857 $nm^2$. The PSD was then determined by numerically Fourier transforming h(x,y). The resulting PSD and the wavenumber-PSD product were substantially azimuthally symmetric. The azimuthal average of the PSD and of the wavenumber-PSD product are shown in FIGS. 15 and 16, respectively. The low wavenumber peak visible in FIG. 15 is believed to be due to the relatively small area used in determining the PSD and would not expected to be present if a larger sample size were used.

Tool B

Figure 17:
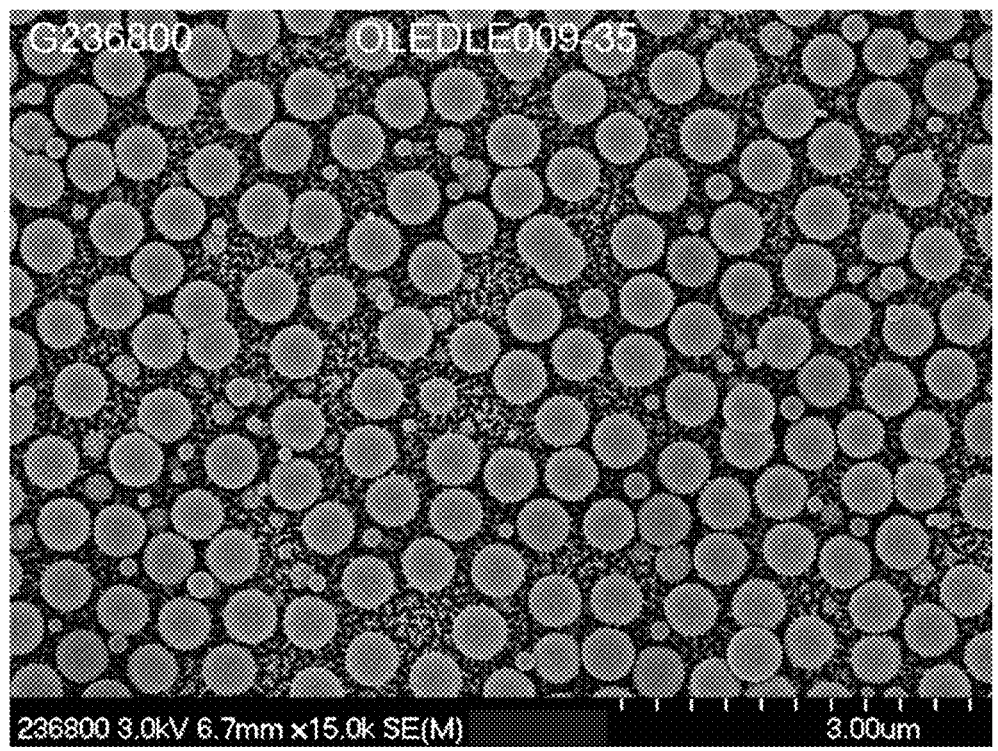
FIG. 17 is an image of a nanostructured surface of a tool.
Figure 18:
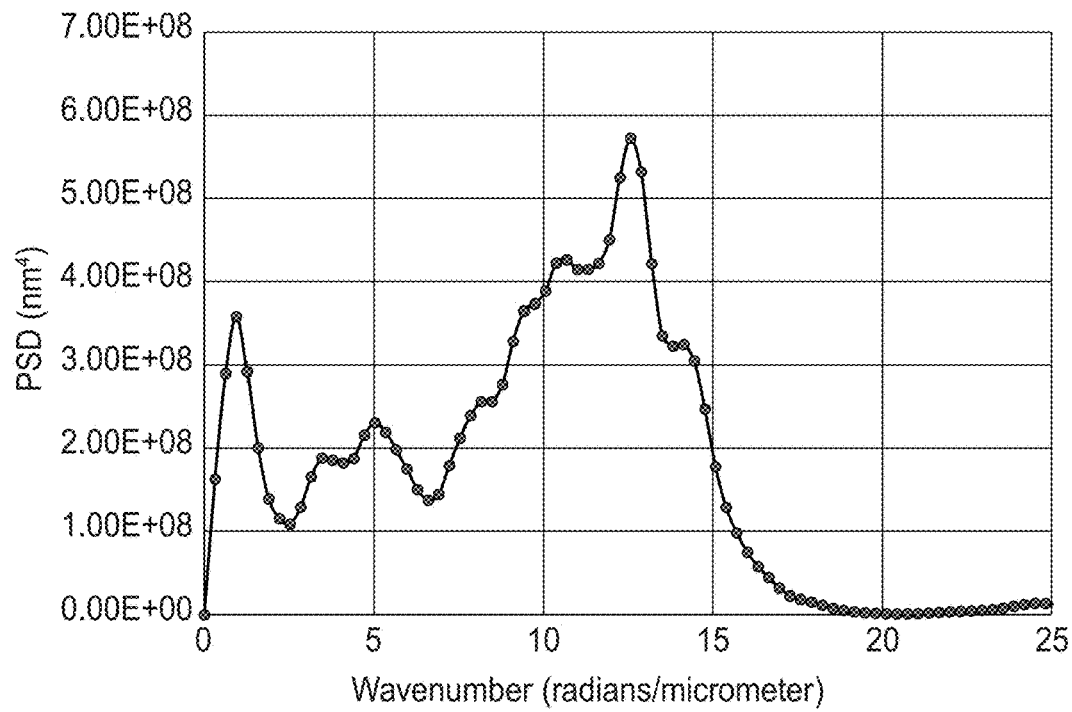
FIG. 18 is a plot of the PSD of the nanostructured surface of the tool of FIG. 17.
Figure 19:
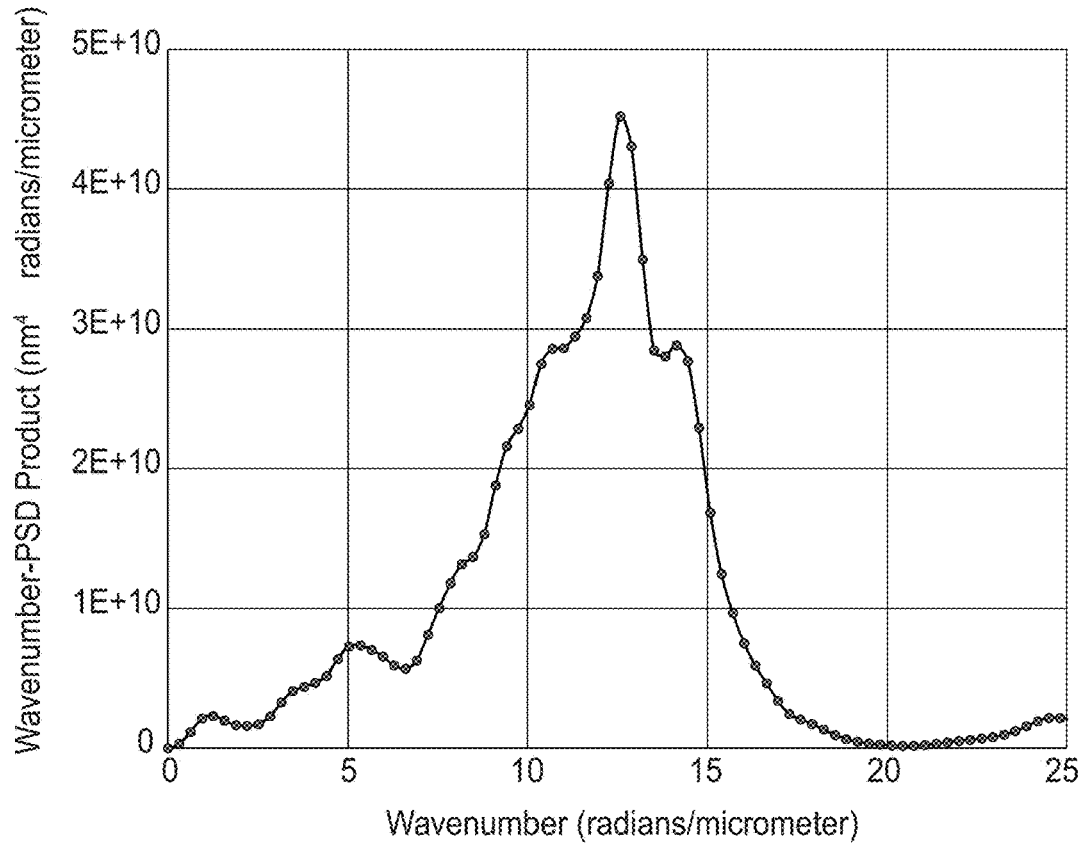
FIG. 19 is a plot of the wavenumber-PSD product of the nanostructured surface of the tool of FIG. 17.

Tool B was made similarly to Tool A, except that a lower loading of $SiO_2$ nanoparticles (40 percent by weight) was used in making the coating for the nanoparticle coated PET film which was subsequently UV cured and etched. A micrograph of Tool B is shown in FIG. 17 where it can be seen that a lower loading of particles was used. The sample size analyzed for determining the variance and the PSD of the nanostructured surface was 7.60 micrometers by 5.47 micrometers (for an area of about 41.5 micrometers$^2$). The variance, Var, in displacement h(x,y) was determined to be 6823 $nm^2$. The PSD was determined using the techniques described for for Tool A. The azimuthal average of the PSD and of the wavenumber-PSD product are shown in FIGS. 18 and 19, respectively. The low wavenumber peak visible in FIG. 18 is believed to be due to the relatively small area used in determining the PSD and would not expected to be present if a larger sample size were used.

Tool C

Tool C is made similarly to Tool A, except that that the particle diameters are reduced by a factor of 2.2 and the average spacing between particles are reduced by a factor of 2.2. The PSD and wavenumber-PSD product for Tool C is given by the PSD and wavenumber-PSD product for Tool A with all length scales reduced by a factor of 2.2.

Tool D

Tool D is made similarly to Tool B, except that that the particle diameters are reduced by a factor of 2.2 and the average spacing between particles are reduced by a factor of 2.2. The PSD and wavenumber-PSD product for Tool C is given by the PSD and wavenumber-PSD product for Tool B with all length scales reduced by a factor of 2.2.

Example 3

Figure 20:
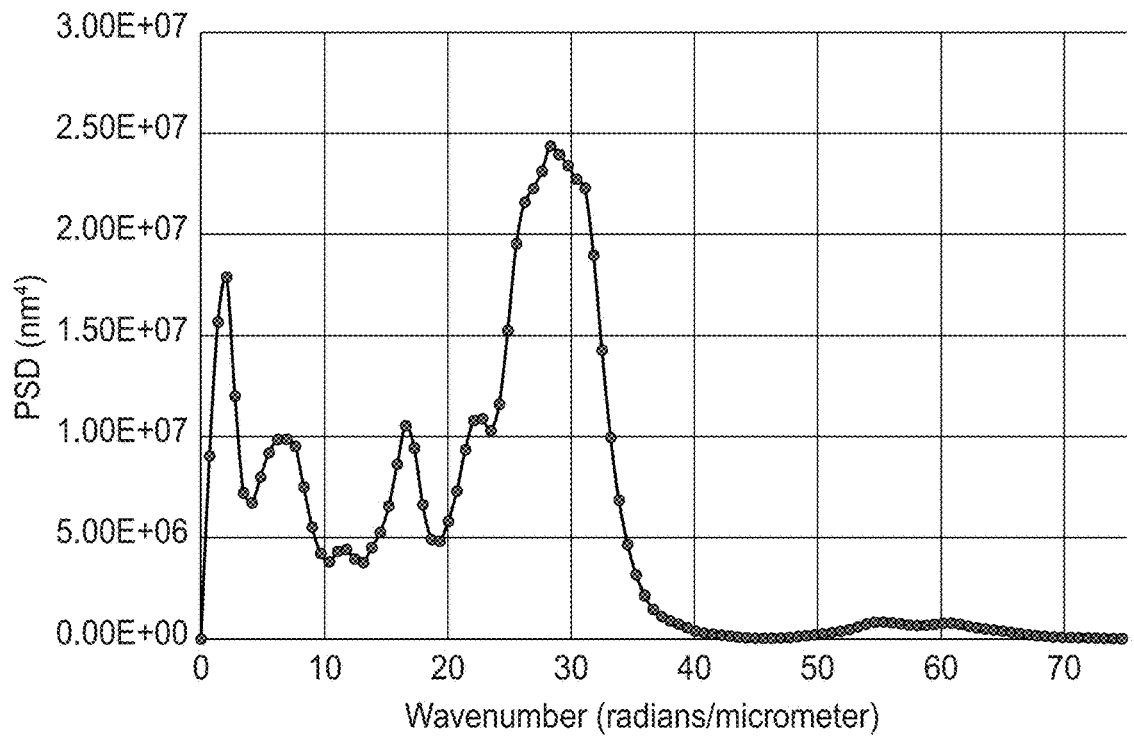
FIG. 20 is a plot of the PSD of a nanostructured interface.
Figure 21:
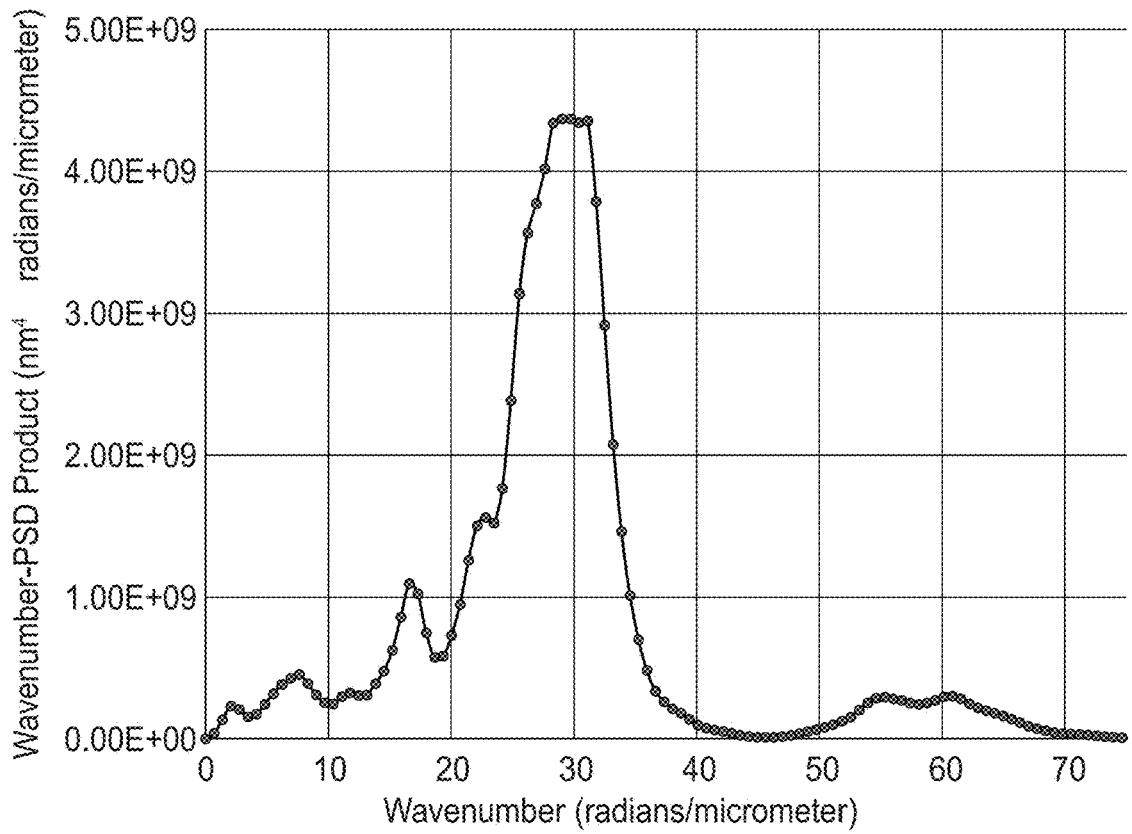
FIG. 21 is a plot of the wavenumber-PSD product of a nanostructured interface.

An optical stack including a nanostructured interface disposed between first and second layers is made using a continuous cast and cure process to make a first layer having a structured surface followed by filling the structured surface with a high index backfill to form the second layer as described in U.S. Pat. Appl. Pub. No. 2010/0110551 (Lamansky et al.) except that Tool C is used to make the structured surface. The PSD and wavenumber-PSD product for the nanostructured interface are the same as those for Tool C and are shown in FIGS. 20 and 21, respectively. The variance, Var, in the displacement of the nanostructured interface from a mean plane of the interface is 1417 $nm^2$.

The nanostructured interface can be described as having a kin of 22 radians/micrometer, for example, and a kout of 33 radians/micrometer, for example. The optical stack is disposed on an encapsulated emissive OLED layer in order to reduce the variation of color with view angle.

Example 4

Figure 22:
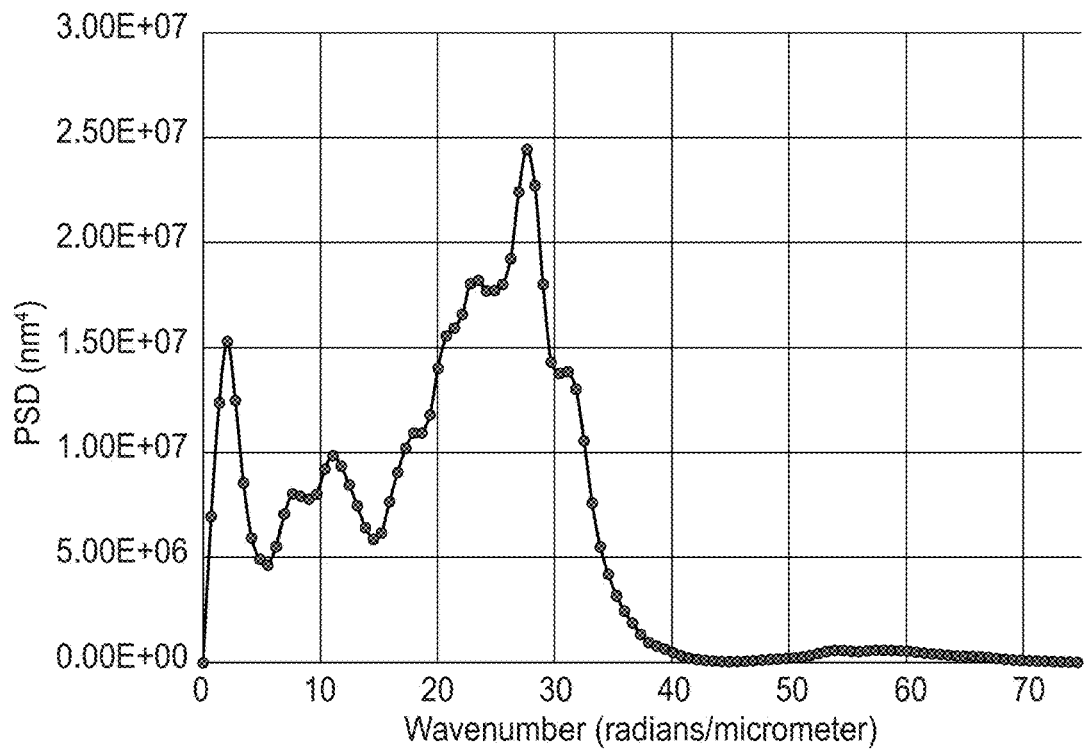
FIG. 22 is a plot of the PSD of a nanostructured interface.
Figure 23:
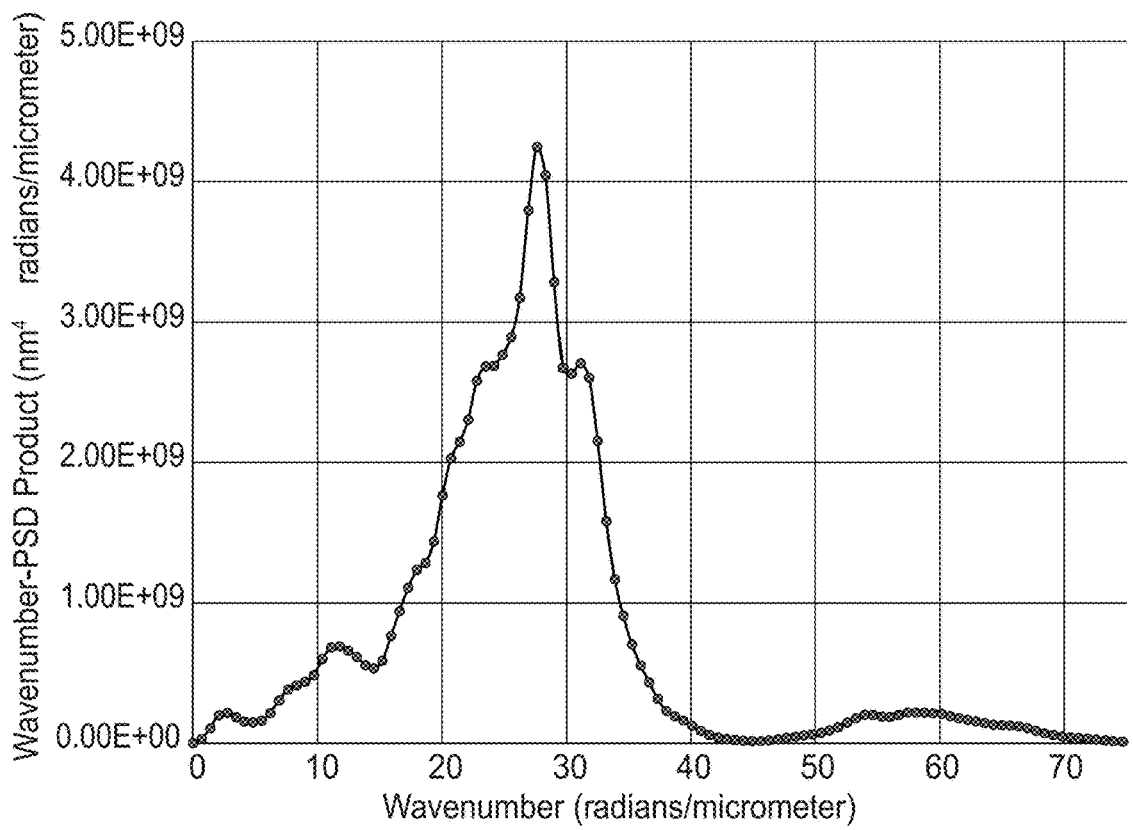
FIG. 23 is a plot of the wavenumber-PSD product of a nanostructured interface.

An optical stack including a nanostructured interface disposed between first and second layers is made using a continuous cast and cure process to make a first layer having a structured surface followed by filling the structured surface with a high index backfill to form the second layer as described in U.S. Pat. Appl. Pub. No. 2010/0110551 (Lamansky et al.) except that Tool D is used to make the structured surface. The PSD and wavenumber-PSD product for the nanostructured interface are the same as those for Tool D and are shown in FIGS. 22 and 23, respectively. The variance, Var, in the displacement of the nanostructured interface from a mean plane of the interface is 1410 $nm^2$. The nanostructured interface can be described as having a kin of 18 radians/micrometer, for example, and a kout of 33 radians/micrometer, for example. The optical stack is disposed on an encapsulated emissive OLED layer in order to reduce the variation of color with view angle.

Tool E

Figure 24:
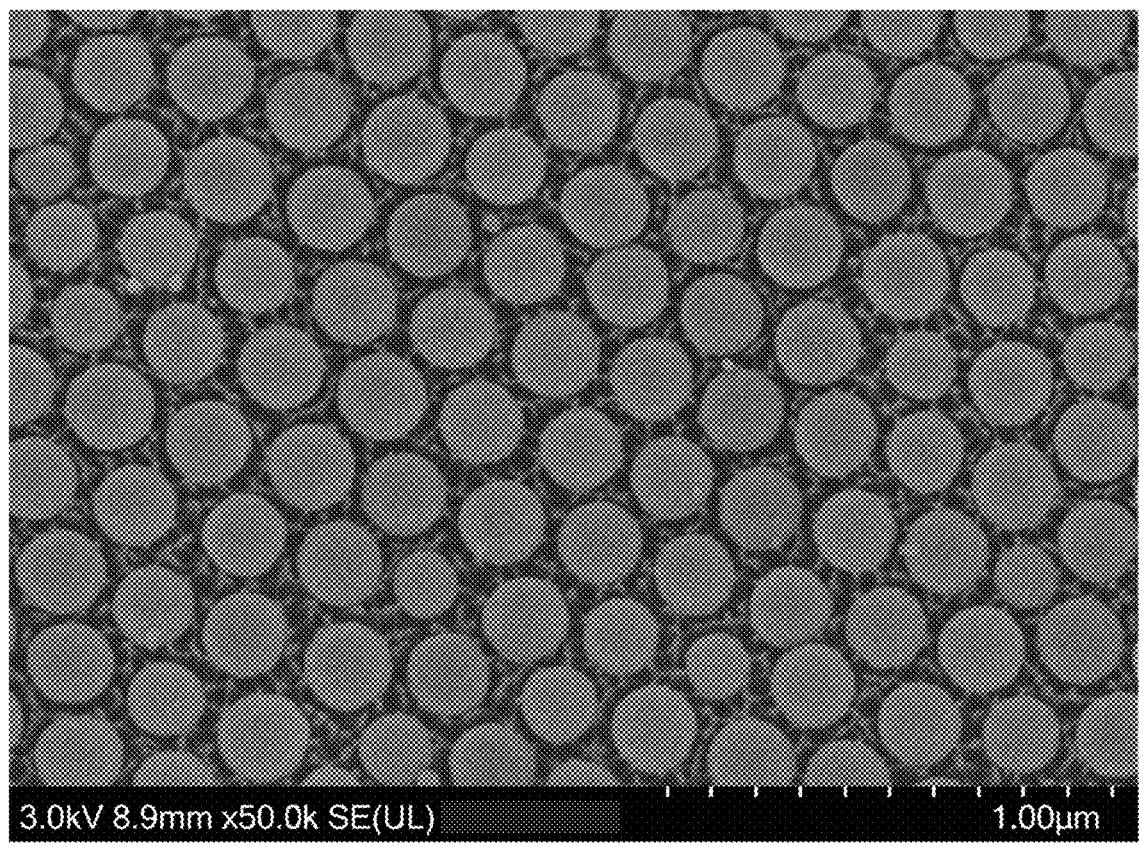
FIG. 24 is an image of a nanostructured surface of a tool.
Figure 25:
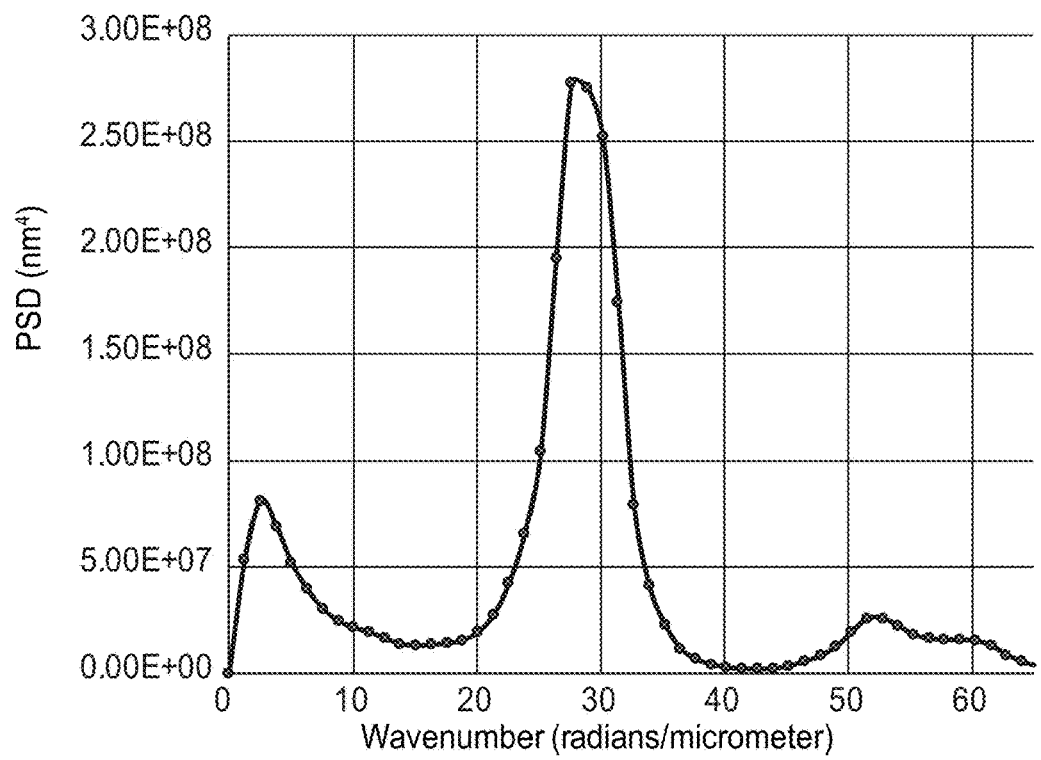
FIG. 25 is a plot of the PSD of the nanostructured surface of the tool of FIG. 24.
Figure 26:
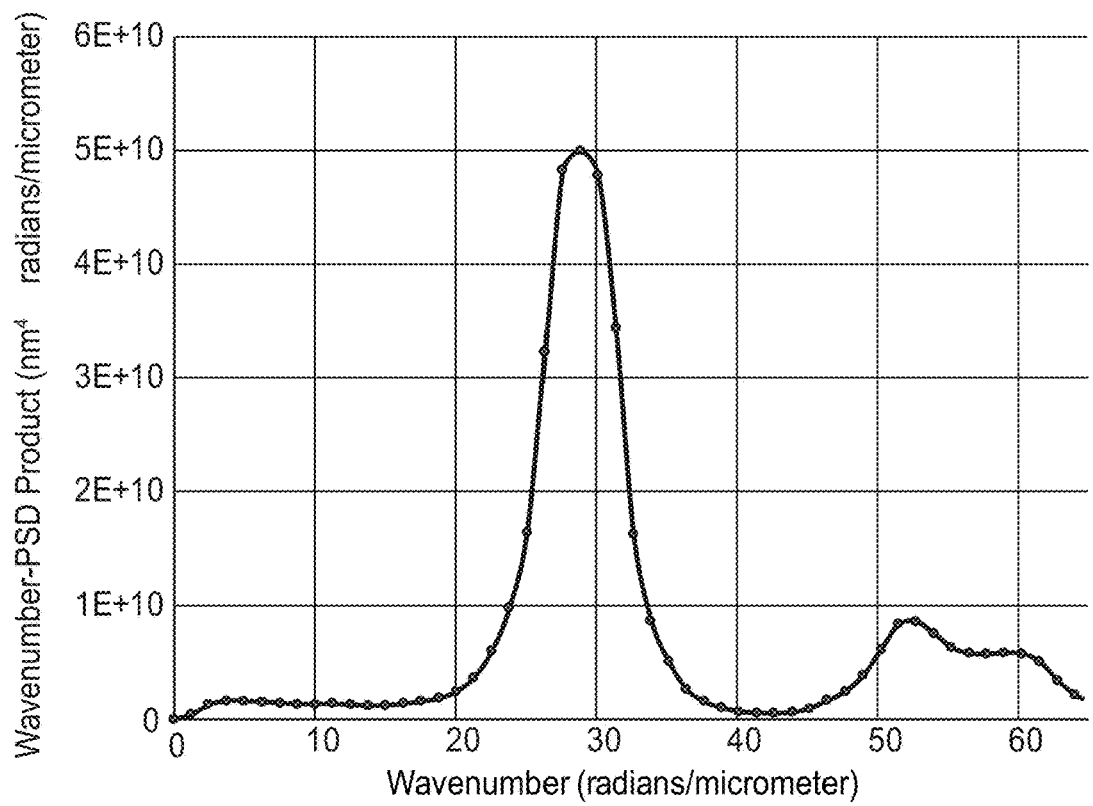
FIG. 26 is a plot of the wavenumber-PSD product of the nanostructured surface of the tool of FIG. 24.

Tool E was made similarly to Tool A, except that the $SiO_2$ nanoparticles had an average particle diameter of 190 nm, a loading of 45 weight percent was used in making the nanoparticle coated PET film which was subsequently etched, and a 20 second etch time was used. The nanoparticle coating was a substantially monolayer coating having a thickness of 200 nm. A micrograph of Tool E is shown in FIG. 24. The sample size analyzed for determining the variance and the PSD of the nanostructured surface was 2.46 micrometers by 1.70 micrometers (for an area of about 4.19 micrometers). The variance, Var, in displacement h(x,y) was determined to be 15249 $nm^2$. The PSD was determined using the techniques described for Tool A. The azimuthal average of the PSD and of the wavenumber-PSD product are shown in FIGS. 25 and 26, respectively. The low frequency peak visible in FIG. 25 is believed to be due to the relatively small area used in determining the PSD and would not be expected to be present if a larger sample size were used.

Example 5

An optical stack including a nanostructured interface disposed between first and second layers is made using a continuous cast and cure process to make a first layer having a structured surface followed by filling the structured surface with a high index backfill to form the second layer as described in U.S. Pat. Appl. Pub. No. 2010/0110551 (Lamansky et al.) except that Tool E is used to make the structured surface. The PSD and wavenumber-PSD product for the nanostructured interface are the same as those for Tool D which are shown in FIGS. 25 and 26, respectively. The variance, Var, in the displacement of the nanostructured interface from a mean plane of the interface is 15249 $nm^2$. The nanostructured interface can be described as having a kin of 23 radians/micrometer, for example, and a kout of 34 radians/micrometer, for example. The optical stack is disposed on an encapsulated emissive OLED layer in order to reduce the variation of color with view angle.

The following is a list of exemplary embodiments of the present description.

Embodiment 1 is an organic light emitting diode (OLED) display comprising:
an emissive OLED layer; and a nanostructured interface between first and second layers, the second layer disposed between the first layer and the emissive OLED layer, the first layer having a first refractive index, the second layer having a different second refractive index being at least 1.4, the nanostructured interface disposed proximate to an outside an evanescent zone of the emissive OLED layer, the nanostructured interface having a substantially azimuthally symmetric power spectral density, PSD, a wavenumber-PSD product having a maximum for a wavenumber larger than 6 radians/micrometer times the second refractive index, wherein for all wavenumbers less than 6 radians/micrometer times the second refractive index, the wavenumber-PSD product is no more than 0.3 times the maximum.

Embodiment 2 is the OLED display of Embodiment 1, wherein for all wavenumbers less than 6 radians/micrometer times the second refractive index, the wavenumber-PSD product is no more than 0.2 times the maximum.

Embodiment 3 is the OLED display of Embodiment 1, wherein for all wavenumbers less than 6 radians/micrometer times the second refractive index, the wavenumber-PSD product is no more than 0.1 times the maximum.

Embodiment 4 is the OLED display of Embodiment 1, wherein for all wavenumbers less than 8 radians/micrometer times the second refractive index, the wavenumber-PSD product is no more than 0.3 times the maximum.

Embodiment 5 is the OLED display of Embodiment 1, wherein for all wavenumbers less than 9 radians/micrometer times the second refractive index, the wavenumber-PSD product is no more than 0.3 times the maximum.

Embodiment 6 is the OLED display of Embodiment 1, wherein for all wavenumbers less than 10 radians/micrometer times the second refractive index, the wavenumber-PSD product is no more than 0.3 times the maximum.

Embodiment 7 is the OLED display of Embodiment 1, wherein the power spectral density is no more than 0.3 times a maximum of the power spectral density for wavenumbers less than 6 radians/micrometer times the second refractive index.

Embodiment 8 is the OLED display of Embodiment 1, wherein the power spectral density is no more than 0.1 times a maximum of the power spectral density for wavenumbers less than 6 radians/micrometer times the second refractive index.

Embodiment 9 is the OLED display of Embodiment 1, wherein the power spectral density is no more than 0.1 times a maximum of the power spectral density for wavenumbers less than 8 radians/micrometer times the second refractive index.

Embodiment 10 is the OLED display of Embodiment 1, wherein the power spectral density is at least 0.1 times a maximum of the power spectral density for at least one wavenumber larger than 13 radians/micrometer times a sum of the second refractive index and 0.8.

Embodiment 11 is the OLED display of Embodiment 1 having an average pixel spacing, wherein the nanostructured interface has an average spacing between nearest neighbor peaks of less than 0.1 times the average pixel spacing.

Embodiment 12 is the OLED display of Embodiment 1, wherein the nanostructured interface has an average spacing between nearest neighbor peaks in a range of 100 nm to 350 nm.

Embodiment 13 is the OLED display of Embodiment 1, wherein an encapsulant is disposed between the nanostructured interface and the emissive OLED layer.

Embodiment 14 is the OLED display of Embodiment 1, wherein the second refractive index is greater than the first refractive index.

Embodiment 15 is the OLED display of Embodiment 1, wherein the second refractive index is at least 1.6.

Embodiment 16 is the OLED display of Embodiment 1, wherein the second refractive index is at least 1.7.

Embodiment 17 is the OLED display of Embodiment 1, wherein each of the first and second layers comprise a continuous polymeric phase.

Embodiment 18 is the OLED display of Embodiment 1, wherein the second layer comprises a plurality of nanoparticles.

Embodiment 19 is the OLED display of Embodiment 1, wherein a substantially azimuthally symmetric power spectral density is a power spectral density wherein for any first wavevector having a first magnitude between 10 radians/micrometer times the second refractive index and 13 radians/micrometer times a sum of the second refractive index and 0.8, a maximum difference between a local average of the power spectral density at the first wavevector is between 0.7 and 1.3 times an annular average of the power spectral density at the first wavevector, the local average being an average of the power spectral density over an annular sector in Fourier space centered on the first wavevector and having an inner radius of 0.9 times the first magnitude, an outer radius of 1.1 times the first magnitude, and a subtended angle of 60 degrees, the annular average being an average of the power spectral density over an annulus in Fourier space having an inner radius of 0.9 times the first magnitude and an outer radius of 1.1 times the first magnitude.

Embodiment 20 is the OLED display of Embodiment 1, wherein for any first wavevector having a first magnitude between 10 radians/micrometer times the second refractive index and 13 radians/micrometer times a sum of the second refractive index and 0.8, a maximum difference between a local average of the power spectral density at the first wavevector is between 0.7 and 1.3 times an annular average of the power spectral density at the first wavevector, the local average being an average of the power spectral density over an annular sector in Fourier space centered on the first wavevector and having an inner radius of 0.9 times the first magnitude, an outer radius of 1.1 times the first magnitude, and a subtended angle of 30 degrees, the annular average being an average of the power spectral density over an annulus in Fourier space having an inner radius of 0.9 times the first magnitude and an outer radius of 1.1 times the first magnitude.

Embodiment 21 is the OLED display of Embodiment 1, wherein the power spectral density has at least a 6-fold rotation symmetry.

Embodiment 22 is the OLED display of Embodiment 1, wherein an annular average of the wavenumber-PSD product has a maximum annular average at a wavenumber larger than 8 radians/micrometer times the second refractive index, and wherein for any wavenumber less than 8 radians/micrometer times the second refractive index, the wavenumber-PSD product is no more than 0.1 times the maximum annular average.

Embodiment 23 is the OLED display of Embodiment 1, wherein an annular average of the PSD has a maximum annular average at a wavenumber larger than 8 radians/micrometer times the second refractive index, and wherein for any wavenumber less than 8 radians/micrometer times the second refractive index, the PSD is no more than 0.2 times the maximum annular average.

Embodiment 24 is the OLED display of Embodiment 1, wherein the second refractive index is at least 1.6, the nanostructured interface has a variance in displacement from a mean displacement of the interface of Var, and a first integral of the PSD over an area contained in and bound by a circle in Fourier space centered at zero wavenumber and having a radius of 9 radians/micrometer times the second refractive index is no more than 4 times Var.

Embodiment 25 is the OLED display of Embodiment 1, further comprising an interior layer disposed between the emissive OLED layer and the nanostructured interface; wherein when the display is fully on, a first light output from the emissive OLED layer at a view angle of zero degrees relative to a normal to the display has a first color in the interior layer and a second color exterior to the display, a second light output from the emissive OLED layer at a view angle of 45 degrees relative to the normal to the display has a third color in the interior layer and a fourth color exterior to the display, the first and third colors having a first chromaticity distance therebetween, the second and fourth colors having a second chromaticity distance therebetween, the nanostructured interface being configured such that the second chromaticity distance is less than 0.75 times the first chromaticity distance.

Embodiment 26 is an organic light emitting diode (OLED) display comprising:
an emissive OLED layer;
a nanostructured interface disposed proximate to the emissive OLED layer; and
an interior layer disposed between the emissive OLED layer and the nanostructured interface; wherein when the display is fully on, a first light output from the emissive OLED layer at a view angle of zero degrees relative to a normal to the display has a first color in the interior layer and a second color exterior to the display, a second light output from the emissive OLED layer at a view angle of 45 degrees relative to the normal to the display has a third color in the interior layer and a fourth color exterior to the display, the first and third colors having a first chromaticity distance therebetween, the second and fourth colors having a second chromaticity distance therebetween, the nanostructured interface being configured such that the second chromaticity distance is less than 0.75 times the first chromaticity distance.

Embodiment 27 is the OLED display of Embodiment 26, wherein the nanostructured interface is configured such that the second chromaticity distance is less than 0.6 times the first chromaticity distance.

Embodiment 28 is the OLED display of Embodiment 26, wherein the nanostructured interface is configured such that the second chromaticity distance is less than 0.5 of the first chromaticity distance.

Embodiment 29 is the OLED display of Embodiment 26, wherein the first and second colors are the same.

Embodiment 30 is the OLED display of Embodiment 26, wherein the interior layer is an OLED encapsulating layer.

Embodiment 31 is the OLED display of Embodiment 26, wherein the second layer disposed between the first layer and the emissive OLED layer, the first layer having a first refractive index being at least 1.4, the second layer having a larger second refractive index being at least 1.6.

Embodiment 32 is the OLED display of Embodiment 31, wherein the second refractive index is at least 1.7.

Embodiment 33 is the OLED display of Embodiment 31, wherein each of the first and second layers comprise a continuous polymeric phase and the nanostructured interface is a continuous interface between the first and second layers.

Embodiment 34 is the OLED display of Embodiment 26, wherein the nanostructured interface has a power spectral density such that for any first wavevector having a first magnitude between 10 radians/micrometer times the second refractive index and 13 radians/micrometer times a sum of the second refractive index and 0.8, a maximum difference between a local average of the power spectral density at the first wavevector is between 0.7 and 1.3 times an annular average of the power spectral density at the first wavevector, the local average being an average of the power spectral density over an annular sector in Fourier space centered on the first wavevector and having an inner radius of 0.9 times the first magnitude, an outer radius of 1.1 times the first magnitude, and a subtended angle of 60 degrees, the annular average being an average of the power spectral density over an annulus in Fourier space having an inner radius of 0.9 times the first magnitude and an outer radius of 1.1 times the first magnitude.

Embodiment 35 is an organic light emitting diode (OLED) display comprising:

an emissive OLED layer; and a nanostructured interface between two adjacent layers, the nanostructured interface disposed proximate to and outside an evanescent zone of the emissive OLED layer, the nanostructured interface having a substantially azimuthally symmetric power spectral density, wherein the nanostructured interface is configured to provide substantially no diffractive transmission for light from the emissive OLED layer at a view direction normal to the emissive OLED layer, and the nanostructured interface is configured to provide diffractive transmission for light from the emissive OLED layer in at least some view directions at an angle greater than 10 degrees to normal.

Embodiment 36 is the OLED display of Embodiment 35, wherein the nanostructured interface is configured to provide diffractive transmission for light from the emissive OLED layer in at least some view directions at an angle greater than 20 degrees to normal.

Embodiment 37 is the OLED display of Embodiment 35, wherein the nanostructured interface is configured to provide diffractive transmission for light from the emissive OLED layer in at least some view directions at an angle greater than 30 degrees to normal.

Embodiment 38 is the OLED display of Embodiment 35, wherein the two adjacent layers include a first layer having a first refractive index, and a second layer disposed between the first layer and the emissive OLED layer, the second layer having a second refractive index of at least 1.5.

Embodiment 39 is the OLED display of Embodiment 38, wherein the second refractive index is at least 1.6.

Embodiment 40 is the OLED display of Embodiment 38, wherein the second refractive index is at least 1.7.

Embodiment 41 is the OLED display of Embodiment 35, wherein an OLED encapsulating layer is disposed between the emissive OLED layer and the nanostructured interface.

Embodiment 42 is an organic light emitting diode (OLED) display comprising:

an emissive OLED layer; and a nanostructured interface between first and second layers, the second layer disposed between the first layer and the emissive OLED layer, the first layer having a first refractive index, the second layer having a different second refractive index, the second refractive index being at least 1.6, the nanostructured interface disposed proximate to and outside an evanescent zone of the emissive OLED layer, the nanostructured interface having a variance in displacement from a mean displacement of the interface, Var, and a substantially azimuthally symmetric power spectral density, PSD, wherein a first integral of the PSD over an area bound by a circle in Fourier space centered at zero wavenumber and having a radius of 9 radians/micrometer times the second refractive index is no more than 4 times Var.

Embodiment 43 is the OLED display of Embodiment 42, wherein the first integral is no more than 2 times Var.

Embodiment 44 is the OLED display of Embodiment 42, wherein the first integral is no more than Var.

Embodiment 45 is the OLED display of Embodiment 42, wherein a second integral of the PSD over a two-dimensional annulus in Fourier space is between 0.8 and 1.0 times $(2\pi)^2$ Var, the annulus having an inner wavenumber of 9 radians/micrometer times the second refractive index and an outer wavenumber of 16 radians/micrometer times the sum of the second refractive index and 0.9.

Embodiment 46 is the OLED display of Embodiment 45, wherein the second integral is between 0.9 and 1.0 times $(2\pi)^2$ Var.

Embodiment 47 is the OLED display of Embodiment 45, wherein the second integral is about $(2\pi)^2$ Var.

Embodiment 48 is the OLED display of Embodiment 45, wherein a wavenumber-PSD product has a maximum for a wavenumber larger than 6 radians/micrometer times the second refractive index and wherein for all second wavenumbers less than 6 radians/micrometer times the second refractive index, the wavenumber-PSD product is no more than 0.3 times the first wavenumber times the maximum.

Embodiment 49 is the OLED display of Embodiment 45, wherein a wavenumber-PSD product has a maximum for a wavenumber larger than 6 radians/micrometer times the second refractive index and wherein for all wavenumbers less than 6 radians/micrometer times the second refractive index, the wavenumber-PSD product is no more than 0.1 times the maximum.

Embodiment 50 is the OLED display of Embodiment 45, wherein the power spectral density has a maximum for a wavenumber larger than 6 radians/micrometer times the second refractive index and the power spectral density is no more than 0.3 times the maximum for wavenumbers less than 6 radians/micrometer times the second refractive index.

Embodiment 51 is the OLED display of Embodiment 45, wherein the power spectral density has a maximum for a wavenumber larger than 8 radians/micrometer times the second refractive index and the power spectral density is no more than 0.1 times the maximum for wavenumbers less than 8 radians/micrometer times the second refractive index.

Embodiment 52 is a method of reducing variation of color with view angle in an organic light emitting diode (OLED) display comprising:

providing an encapsulated emissive OLED layer;

disposing an optical stack onto the encapsulated emissive OLED layer, the optical stack including a nanostructured interface between continuous first and second layers, the second layer disposed between the first layer and the encapsulated emissive OLED layer, the first layer having a first refractive index, the second layer having a different second refractive index, the optical stack configured to reduce color variation with view angle of light output from the OLED display, wherein the nanostructured interface has a substantially azimuthally symmetric power spectral density.

Embodiment 53 is the method of Embodiment 52, wherein the emissive OLED layer comprises a plurality of colored subpixels, the disposing step comprises providing the optical stack, the providing step comprising:

determining a characteristic wavelength at zero view angle of the emissive OLED layer;
determining a highest view angle of the emissive OLED layer where it is desired to preserve a light output of the emissive OLED layer without color correction;
determining a length scale as the center wavelength divided by a sum of the second refractive index and a sine of the highest view angle; and
forming the nanostructured interface such that an integral of the power spectral density of the nanostructured interface over an area contained in and bounded by a circle in Fourier space centered at zero wavenumber and having a radius of 6 radians divided by the length scale is no more than 4 times a variance in displacement from a mean displacement of the nanostructured interface.

Embodiment 54 is the method of Embodiment 53, wherein an integral of the power spectral density of the nanostructured interface over an area contained in and bounded by a circle in Fourier space centered at zero wavenumber and having a radius of 8 radians divided by the length scale is no more than 4 times a variance in displacement from a mean displacement of the nanostructured interface.

Embodiment 55 is the method of Embodiment 53, wherein the power spectral density has a maximum for a wavenumber larger than 6 radians divided by the length scale and the power spectral density is no more than 0.3 times the maximum for wavenumbers less than 6 radians divided by the length scale.

Embodiment 56 is the method of Embodiment 53, wherein a wavenumber-PSD product has a maximum for a wavenumber larger than 6 radians/micrometer times the second refractive index, and wherein for all wavenumbers less than 6 radians/micrometer times the second refractive index, the wavenumber-PSD product is no more than 0.3 times the maximum.

Embodiment 57 is the method of Embodiment 53, wherein a wavenumber-PSD product has a maximum for a wavenumber larger than 6 radians/micrometer times the second refractive index, and wherein for all wavenumbers less than 6 radians/micrometer times the second refractive index, the wavenumber-PSD product is no more than 0.1 times the maximum.

Embodiment 58 is the method of Embodiment 53, wherein an integral of the power spectral density over a two-dimensional annulus in Fourier space is between 0.8 and 1.0 times $(2\pi)^2$ times a variance in displacement from a mean displacement of the nanostructured interface, the annulus having an inner wavenumber of 9 radians/micrometer times the second refractive index and an outer wavenumber of 16 radians/micrometer times the sum of the second refractive index and 0.9.

Embodiment 59 is the method of Embodiment 53, wherein the forming step comprises:
making a tool and using the tool to form a nanostructured surface on the first layer; and backfilling the nanostructured surface to form the second layer and the nanostructured interface.

Embodiment 60 is the method of Embodiment 59, wherein the making step comprises:
providing a layer comprising nanoparticles dispersed in a polymeric precursor matrix;
drying or curing the layer; and
etching the dried or cured layer.

Embodiment 61 is the method of Embodiment 60, wherein the drying or curing step comprises both drying and curing the layer.

Embodiment 62 is the method of Embodiment 53, wherein the second refractive index is greater than 1.7.

Embodiment 63 is the method of Embodiment 53, wherein the colored subpixels have a shortest center wavelength, a longest center wavelength, and an intermediate center wavelength, and the characteristic wavelength is the intermediate center wavelength.

Embodiment 64 is the method of Embodiment 53, wherein the colored subpixels have a shortest center wavelength, a longest center wavelength, and an intermediate center wavelength, and the characteristic wavelength is the shortest center wavelength.

Embodiment 65 is the use of an optical stack for reducing variation of color with view angle in an organic light emitting diode (OLED) display, the optical stack including a nanostructured interface between first and second layers, the first layer having a first refractive index, the second layer having a different second refractive index, the optical stack being disposed on an encapsulated emissive OLED layer with the second layer between the first layer and the encapsulated emissive OLED layer, the nanostructured interface having a power spectral density such that for any first wavevector having a first magnitude between 10 radians/micrometer times the second refractive index and 13 radians/micrometer times a sum of the second refractive index and 0.8, a maximum difference between a local average of the power spectral density at the first wavevector is between 0.7 and 1.3 times an annular average of the power spectral density at the first wavevector,
the local average being an average of the power spectral density over an annular sector in Fourier space centered on the first wavevector and having an inner radius of 0.9 times the first magnitude, an outer radius of 1.1 times the first magnitude, and a subtended angle of 60 degrees, the annular average being an average of the power spectral density over an annulus in Fourier space having an inner radius of 0.9 times the first magnitude and an outer radius of 1.1 times the first magnitude.

Embodiment 66 is the use of an optical stack as in Embodiment 65, wherein the second refractive index is larger than the first refractive index.

Embodiment 67 is the use of an optical stack as in Embodiment 66, wherein the second refractive index is greater than 1.6.

Embodiment 68 is the use of an optical stack as in Embodiment 67, wherein the power spectral density has a maximum for a wavenumber larger than 6 radians/micrometer times the second refractive index and the power spectral density is no more than 0.3 times the maximum for wavenumbers less than 6 radians/micrometer times the second refractive index.

Embodiment 69 is the use of an optical stack as in Embodiment 67, wherein a wavenumber-PSD product has a maximum for a wavenumber larger than 6 radians/micrometer times the second refractive index, and
wherein for all wavenumbers less than 6 radians/micrometer times the second refractive index, the wavenumber-PSD product is no more than 0.3 times the maximum.

Embodiment 70 is the use of an optical stack as in Embodiment 67, wherein an integral of the power spectral density over a two-dimensional annulus in Fourier space is between 0.8 and 1.0 times $(2\pi)^2$ times a variance in displacement from a mean displacement of the nanostructured interface, the annulus having an inner wavenumber of 9 radians/micrometer times the second refractive index and an outer wavenumber of 16 radians/micrometer times the sum of the second refractive index and 0.9.

Embodiment 71 is the use of an optical stack as in Embodiment 65, wherein the emissive OLED layer comprises a plurality of colored subpixels, the colored subpixels comprising a shortest center wavelength ($\lambda$a, a longest center wavelength, and an intermediate center wavelength, and wherein an integral of the power spectral density over a two-dimensional annulus in Fourier space is between 0.8 and 1.0 times $(2\pi)^2$ times a variance in displacement from a mean displacement of the nanostructured interface, the annulus having an inner wavenumber in a range of 1.8 $\pi$n2/$\lambda$a to 2$\pi$n2/$\lambda$a and an outer wavenumber in a range of 2$\pi$(n2+0.8)/$\lambda$a to 2.2$\pi$(n2+0.9)/$\lambda$a, n2 being the second refractive index.

Embodiment 72 is the use of an optical stack for reducing variation of color with view angle in an organic light emitting diode (OLED) display, the optical stack including a nanostructured interface between first and second layers, the first layer having a first refractive index, the second layer having a different second refractive index, the optical stack being disposed on an encapsulated emissive OLED layer with the second layer between the first layer and the encapsulated emissive OLED layer, the nanostructured interface having a substantially azimuthally symmetric power spectral density.

Embodiment 73 is the use of an optical stack as in Embodiment 72, wherein the emissive OLED layer comprises a plurality of colored subpixels, the colored subpixels comprising a shortest center wavelength $\lambda$a, a longest center wavelength, and an intermediate center wavelength, and wherein an integral of the power spectral density over a two-dimensional annulus in Fourier space is between 0.8 and 1.0 times $(2\pi)^2$ times a variance in displacement from a mean displacement of the nanostructured interface, the annulus having an inner wavenumber in a range of 1.8$\pi$n2/$\lambda$a to 2$\pi$n2/$\lambda$a and an outer wavenumber in a range of 2$\pi$(n2+0.9)/$\lambda$a to 2.2$\pi$(n2+0.9)/$\lambda$a, n2 being the second refractive index.

Embodiment 74 is the use of an optical stack as in Embodiment 73, wherein the inner wavenumber is 2$\pi$ n2/$\lambda$a and the outer wavenumber is 2$\pi$(n2+0.9)/$\lambda$a.

Embodiment 75 is the OLED display of Embodiment 1, wherein the emissive OLED layer comprises a plurality of colored subpixels, the colored subpixels comprising a shortest center wavelength $\lambda$a, a longest center wavelength, and an intermediate center wavelength, wherein the second refractive index is n2, and wherein for all wavenumbers less than 1.6$\pi$n2/$\lambda$a, the wavenumber-PSD product is no more than 0.3 times the maximum.

Embodiment 76 is the OLED display of Embodiment 75, wherein for all wavenumbers greater than 2.2$\pi$ (n2+0.9)/$\lambda$a, the wavenumber-PSD product is no more than 0.3 times the maximum.

Embodiment 77 is the OLED display of Embodiment 42, wherein the emissive OLED layer comprises a plurality of colored subpixels, the colored subpixels comprising a shortest center wavelength $\lambda$a, a longest center wavelength, and an intermediate center wavelength, and wherein a second integral of the PSD over a two-dimensional annulus in Fourier space is between 0.8 and 1.0 times $(2\pi)^2$ Var, the annulus having an inner wavenumber of at least 1.6$\pi$n2/$\lambda$a and an outer wavenumber of no more than 2.2$\pi$(n2+1)/$\lambda$a, n2 being the second refractive index.

Embodiment 78 is the OLED display of Embodiment 77, wherein the inner wavenumber is in a range of 1.8$\pi$n2/$\lambda$a to 2$\pi$ n2/$\lambda$a and the outer wavenumber is in a range of 2$\pi$ (n2+0.9)/$\lambda$a to 2.2$\pi$ (n2+0.9)/$\lambda$a.

Embodiment 79 is the OLED display of Embodiment 78, wherein the inner wavenumber is 2$\pi$n2/$\lambda$a and the outer wavenumber is 2$\pi$ (n2+0.9)/$\lambda$a.

Embodiment 80 is the OLED display of Embodiment 79, wherein the second integral is between 0.9 and 1.0 times $(2\pi)^2$ Var.

Embodiment 81 is the method of Embodiment 52, wherein the colored subpixels have a shortest center wavelength, a longest center wavelength, and an intermediate center wavelength, and the characteristic wavelength is the shortest center wavelength, wherein an integral of the power spectral density over a two-dimensional annulus in Fourier space is between 0.8 and 1.0 times $(2\pi)^2$ times a variance in displacement from a mean displacement of the nanostructured interface, the annulus having an inner wavenumber of at least 1.6$\pi$ times the second refractive index divided by the shortest center wavelength and an outer wavenumber of no more than 2.2$\pi$ divided by the shortest center wavelength times a sum of the second refractive index and 0.9.

Embodiment 82 is the method of Embodiment 81, wherein the inner wavenumber is 2$\pi$ times the second refractive index divided by the shortest center wavelength and the outer wavenumber is 2$\pi$ divided by the shortest center wavelength times a sum of the second refractive index and 0.9.

Embodiment 83 is the method of Embodiment 82, wherein the integral of the power spectral density over the two-dimensional annulus in Fourier space is between 0.9 and 1.0 times $(2\pi)^2$ times the variance.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof

What is claimed is:

1. An optical stack comprising first and second layers and a nanostructured interface therebetween, the first layer having a first refractive index, the second layer having a different second refractive index being at least 1.4, the nanostructured interface having a substantially azimuthally symmetric power spectral density (PSD), a wavenumber-PSD product having a maximum for a wavenumber larger than 6 radians/micrometer times the second refractive index, wherein for all wavenumbers less than 6 radians/micrometer times the second refractive index, the wavenumber-PSD product is no more than 0.3 times the maximum, and
   wherein the optical stack is configured to be disposed on an encapsulated emissive layer of an organic light emitting diode (OLED) display with the second layer disposed between the first layer and the encapsulated emissive layer and with the nanostructured interface proximate to, and outside of, an evanescent zone of the encapsulated emissive layer to reduce a variation in color with view angle of light emitted from the OLED display.

2. The optical stack of claim 1, wherein the power spectral density is at least 0.1 times a maximum of the power spectral density for at least one wavenumber larger than 13 radians/micrometer times a sum of the second refractive index and 0.8.

3. The optical stack of claim 1, wherein for all wavenumbers less than 6 radians/micrometer times the second refractive index, the wavenumber-PSD product is no more than 0.1 times the maximum.

4. The optical stack of claim 1, wherein for all wavenumbers less than 9 radians/micrometer times the second refractive index, the wavenumber-PSD product is no more than 0.3 times the maximum.

5. The optical stack of claim 1, wherein the second refractive index is at least 1.6, the nanostructured interface has a variance in displacement from a mean displacement of the interface of Var, and a first integral of the PSD over an area contained in and bound by a circle in Fourier space centered at zero wavenumber and having a radius of 9 radians/micrometer times the second refractive index is no more than 4 times Var.

6. The optical stack of claim 1, wherein an annular average of the wavenumber-PSD product has a maximum annular average at a wavenumber larger than 8 radians/micrometer times the second refractive index, and
wherein for any wavenumber less than 8 radians/micrometer times the second refractive index, the wavenumber-PSD product is no more than 0.1 times the maximum annular average.

7. The optical stack of claim 1, wherein the nanostructured interface has an average spacing between nearest neighbor peaks in a range of 100 nm to 350 nm.

8. An optical stack comprising first and second layers and a nanostructured interface therebetween, the first layer having a first refractive index, the second layer having a different second refractive index, the second refractive index being at least 1.6, the nanostructured interface having a variance in displacement from a mean displacement of the interface, Var, and a substantially azimuthally symmetric power spectral density (PSD),
wherein a first integral of the PSD over an area bound by a circle in Fourier space centered at zero wavenumber and having a radius of 9 radians/micrometer times the second refractive index is no more than 4 times Var, and
wherein the optical stack is configured to be disposed on an encapsulated emissive layer of an organic light emitting diode (OLED) display with the second layer disposed between the first layer and the encapsulated emissive layer and with the nanostructured interface proximate to, and outside of, an evanescent zone of the encapsulated emissive layer to reduce a variation in color with view angle of light emitted from the OLED display.

9. The optical stack of claim 8, wherein the first integral is no more than 2 times Var.

10. The optical stack of claim 8, wherein the first integral is no more than Var.

11. The optical stack of claim 8, wherein a second integral of the PSD over a two-dimensional annulus in Fourier space is between 0.8 and 1.0 times $(2\pi)^2$ Var, the annulus having an inner wavenumber of 9 radians/micrometer times the second refractive index and an outer wavenumber of 16 radians/micrometer times the sum of the second refractive index and 0.9.

12. The optical stack of claim 8, wherein for wavenumbers less than 6 radians/micrometer times the second refractive index, the power spectral density is no more than 0.3 times a maximum of the power spectral density.

13. A method of making an optical stack for reducing variation of color with view angle in an organic light emitting diode (OLED) display comprising an emissive OLED layer, the optical stack comprising first and second layers and a nanostructured interface therebetween, the first layer having a first refractive index, the second layer having a different second refractive index being at least 1.4, the method comprising:
determining a characteristic wavelength at zero view angle of the emissive OLED layer;
determining a highest view angle of the emissive OLED layer where it is desired to preserve a light output of the emissive OLED layer without color correction;
determining a length scale as the characteristic wavelength divided by a sum of the second refractive index and a sine of the highest view angle; and
forming the nanostructured interface such that an integral of the power spectral density (PSD) of the nanostructured interface over an area contained in and bounded by a circle in Fourier space centered at zero wavenumber and having a radius of 6 radians divided by the length scale is no more than 4 times a variance in displacement from a mean displacement of the nanostructured interface.

14. The method of claim 13, wherein the PSD is substantially azimuthally symmetric; a wavenumber-PSD product has a maximum for a wavenumber larger than 6 radians/micrometer times the second refractive index; and for all wavenumbers less than 6 radians/micrometer times the second refractive index, the wavenumber-PSD product is no more than 0.3 times the maximum.

15. The method of claim 13, wherein the forming step comprises:
making a tool;
using the tool to form a nanostructured surface on the first layer; and
backfilling the nanostructured surface to form the second layer and the nanostructured interface.

* * * * *